(12) United States Patent
Chau

(10) Patent No.: US 9,949,037 B2
(45) Date of Patent: Apr. 17, 2018

(54) MEMS MICROPHONE AND METHOD FOR FORMING THE SAME

(71) Applicant: MEMSEN ELECTRONICS INC, Nankai District, Tianjin (CN)

(72) Inventor: Manhing Chau, Tianjin (CN)

(73) Assignee: MEMSEN ELECTRONICS INC, Nankai District, Tianjin (CN)

( * ) Notice: Subject to any disclaimer, the term of this patent is extended or adjusted under 35 U.S.C. 154(b) by 172 days.

(21) Appl. No.: 15/013,361

(22) Filed: Feb. 2, 2016

(65) Prior Publication Data

US 2016/0241965 A1     Aug. 18, 2016

(30) Foreign Application Priority Data

Feb. 16, 2015   (CN) .......................... 2015 1 0084456

(51) Int. Cl.

| H04R 19/00 | (2006.01) |
| B81B 3/00 | (2006.01) |
| H04R 23/00 | (2006.01) |
| H04R 19/04 | (2006.01) |
| B81C 1/00 | (2006.01) |
| H04R 31/00 | (2006.01) |

(52) U.S. Cl.
CPC ......... *H04R 19/005* (2013.01); *B81B 3/0021* (2013.01); *B81C 1/00238* (2013.01); (Continued)

(58) Field of Classification Search
CPC .... H04R 19/005; H04R 19/016; H04R 19/04; H04R 23/006; H04R 31/006; (Continued)

(56) References Cited

U.S. PATENT DOCUMENTS

| 9,073,746 B2 * | 7/2015 | Liu .................... B81C 1/00158 |
| 2008/0014682 A1 | 1/2008 | Yang et al. |

(Continued)

FOREIGN PATENT DOCUMENTS

| CN | 102158775 A | 8/2011 |
| CN | 102158789 A | 8/2011 |

(Continued)

OTHER PUBLICATIONS

Taiwanese First Office Action corresponding to Patent No. 105103520; dated Jan. 5, 2017, with English summary.
SIPO First Office Action for corresponding CN Application No. 201510084456.5; dated Aug. 24, 2017.

*Primary Examiner* — Huyen D Le
(74) *Attorney, Agent, or Firm* — Cantor Colburn LLP

(57) ABSTRACT

A Micro-Electro-Mechanical System (MEMS) microphone and a method for forming the same are provided. The method includes: providing a first substrate including a first surface and a second surface opposite to each other; providing a second substrate including a third surface and a fourth surface opposite to each other; bonding the first surface of the first substrate and the third surface of the second substrate to each other; removing a second base of the second substrate to form a fifth surface opposite to the third surface of the second substrate; forming a cavity between the first substrate and the sensitive region of the second substrate; and forming a first conductive plug from the side of the fifth surface of the second substrate, with the first conductive plug passing through to at least one of the conductive layers.

62 Claims, 13 Drawing Sheets

(52) U.S. Cl.
CPC ........... *H04R 19/04* (2013.01); *H04R 23/006* (2013.01); *B81B 2201/0257* (2013.01); *B81C 2203/0792* (2013.01); *H04R 31/006* (2013.01); *H04R 2201/003* (2013.01)

(58) Field of Classification Search
CPC ............ H04R 2201/004; B81B 3/0021; B81B 2201/0257; B81B 2201/0264; B81C 1/00238
USPC ................ 381/113, 116, 174, 175, 190, 191; 29/25.41, 25.42; 438/51, 53; 257/416
See application file for complete search history.

(56) References Cited

U.S. PATENT DOCUMENTS

| | | | |
|---|---|---|---|
| 2014/0003633 A1* | 1/2014 | Liu | H04R 1/04 381/174 |
| 2014/0105428 A1 | 4/2014 | Zoellin et al. | |
| 2014/0109680 A1 | 4/2014 | Tsai | |
| 2014/0233767 A1 | 8/2014 | Chen et al. | |

FOREIGN PATENT DOCUMENTS

| | | | |
|---|---|---|---|
| CN | 102180435 A | 9/2011 | |
| CN | 101296531 B | 8/2012 | |
| CN | 102158787 B | 1/2015 | |
| WO | 2012122871 A1 | 9/2012 | |

\* cited by examiner

MEMS MICROPHONE AND METHOD FOR FORMING THE SAME

CROSS REFERENCE TO RELATED APPLICATIONS

This application claims the priority of Chinese Patent Application No. 201510084456.5, entitled "MEMS MICROPHONE AND METHOD FOR FORMING THE SAME", filed with the Chinese Patent Office on Feb. 16, 2015, which is hereby incorporated by reference in its entirety.

FIELD

The disclosure relates to the field of semiconductor manufacturing technology, and in particular to a Micro-Electro-Mechanical System (MEMS) microphone and a method for forming the MEMS microphone.

BACKGROUND

In recent years, with a rapid development of semiconductor technology, various miniaturized and thinned electronic products have been designed. In a product applied in electric-acoustic field, a microphone is adopted to convert a sound wave into an electrical signal. Many electronic products available on the market are provided with an MEMS (Micro-Electro-Mechanical) microphone. Compared with a common electret microphone (ECM), the MEMS microphone has better heat resistance, shock resistance, and radio frequency immunity.

The MEMS microphone is a miniature microphone manufactured by etching a pressure sensing diaphragm on a semiconductor using a microelectronics mechanical system process. The MEMS microphone is widely applied to a cellphone, a headphone, a notebook computer, a camera and a vehicle. Due to a requirement in compatibility between the MEMS microphone and a Complementary Metal-Oxide-Semiconductor Transistor (CMOS) and a further reduction in the size of the MEMS microphone, a packaging structure of the MEMS microphone has become a focus of recent research. In the conventional art, a CMOS circuit and the MEMS microphone are generally manufactured separately and then are disposed on a base, with the CMOS circuit and the MEMS microphone being connected via a lead wire.

Transmission of an electrical signal between a microphone chip and a CMOS circuit chip is necessary for processing the electrical signal outputted from the microphone chip. Thus, the microphone chip and the CMOS circuit chip are packaged in a system level to form the MEMES microphone.

In a conventional method for manufacturing the MEMS microphone, processes for the manufacturing the microphone chip and the CMOS circuit chip have great differences, and it is difficult to realize monolithic integration. In a case that the CMOS circuit and the microphone are manufactured on a single substrate, the presence of the microphone structure negatively impacts the manufacturing of the CMOS circuit, and the presence of the CMOS circuit makes it difficult to manufacture the microphone structure with a small size. Therefore, it is a complex manufacture procedure to manufacture the CMOS circuit and the microphone structure on a single substrate, and the formed device has a large size, resulting in increased manufacturing cost.

In manufacturing an integrated microphone structure and a CMOS circuit on a single substrate, if components of the microphone structure were manufactured before the CMOS circuit, the substrate is affected by the process for manufacturing the microphone structure, thereby reducing yield of manufacturing the CMOS circuit. If the CMOS circuit were manufactured before the components of the microphone structure, the presence of the CMOS circuit posts great limitations on the selection of materials and process temperatures of the microphone structure, thereby severely degrading the performance of the microphone structure.

Thus, it is urgently needed a method and a structure for effectively integrating the microphone structure and the CMOS circuit.

SUMMARY

The problem to be solved in the present disclosure is to provide a Micro-Electro-Mechanical System (MEMS) microphone and a method for forming the MEMS microphone. The method for forming the MEMS microphone has independent manufacturing processes, flexible material selection, high yield, and a simple integration process, and the formed microphone has improved performance and reliability, decreased size and reduced process cost.

To solve the above problems, a method for forming a Micro-Electro-Mechanical System (MEMS) microphone is provided according the present disclosure, and the method includes: providing a first substrate, where the first substrate includes a first surface and a second surface opposite to the first surface, the first substrate includes at least one conductive layer located at the side of the first surface of the first substrate; providing a second substrate, where the second substrate includes a third surface and a fourth surface opposite to the third surface, the second substrate includes a second base and a sensitive electrode located on or above the second base, the second substrate includes a sensitive region in which the sensitive electrode is located, the sensitive electrode is located at the side of the third surface of the second substrate; bonding the first surface of the first substrate and the third surface of the second substrate to each other; removing the second base to form a fifth surface opposite to the third surface of the second substrate, after the first surface of the first substrate and the third surface of the second substrate are bonded to each other; forming a cavity between the first substrate and the sensitive region of the second substrate; and forming a first conductive plug from the side of the fifth surface of the second substrate, with the first conductive plug passing through to at least one of the conductive layers, where the first conductive plug is used to form an electrical connection between the conductive layer and the sensitive electrode.

Optionally, the method for forming the MEMS microphone may further include forming a fixed electrode, where the fixed electrode is located at the side of the first surface of the first substrate or at the side of the third surface of the second substrate; a position of the fixed electrode corresponding to a position of the sensitive electrode after the first surface of the first substrate and the third surface of the second substrate are bonded to each other; and forming a cavity between the fixed electrode and the sensitive electrode.

Optionally, the method for forming the MEMS microphone may further include: forming a first electrode layer, where the first electrode layer includes the sensitive electrode; forming a second electrode layer, where the second electrode layer includes the fixed electrode; and forming a stopper, where the stopper is located between the first electrode layer and the second electrode layer, with a position of the stopper corresponding to a position of the sensitive region.

Optionally, in a case that the fixed electrode is located at the side of the first surface of the first substrate, the forming the cavity may include: forming a first opening before the first surface of the first substrate and the third surface of the second substrate are bonded to each other, where the first opening is located at the side of the third surface of the second substrate or at the side of the first surface of the first substrate, or the first opening is located both at the side of the first surface of the first substrate and at the side of the third surface of the second substrate, with a position of the first opening corresponding to a position of the sensitive region; and forming a cavity between the first opening and the first surface of the first substrate when the first surface of the first substrate and the third surface of the second substrate are bonded to each other.

Optionally, the forming the second substrate may include: providing a semiconductor on insulator substrate, where the semiconductor on insulator substrate includes a base, an insulating layer on a surface of the base, and a semiconductor layer on a surface of the insulating layer; etching the semiconductor layer to form the fixed electrode or the sensitive electrode; and providing the second base as the base.

Optionally, the method for forming the MEMS microphone may further include: forming a second opening in the first substrate; a position of the second opening corresponding to a position of the sensitive region of the second substrate after the first surface of the first substrate and the third surface of the second substrate are bonded to each other.

Optionally, the second opening may be located at the side of the first surface of the first substrate; or the second opening may pass through the first substrate.

Optionally, the method for forming the MEMS microphone may further include forming a material layer at the side of the third surface of the second substrate. The second substrate further includes a first electrode layer located on or above the second base. The first electrode layer includes the sensitive electrode. The material layer is located between the first electrode layer and the first substrate after the first surface of the first substrate and the third surface of the second substrate are bonded to each other.

Optionally, the first substrate may further include a circuit.

Optionally, the second substrate may further include a second coupling layer located at the side of the third surface, or the first substrate may include a first coupling layer located at the side of the first surface; or the second substrate may further include a second coupling layer located at the side of the third surface, and the first substrate may include a first coupling layer located at the side of the first surface.

Optionally, at least one of the first coupling layer and the second coupling layer may be comprised of an insulating material.

Optionally, the first surface of the first substrate and the third surface of the second substrate may be bonded to each other by an adhesive bonding process; and the first coupling layer or the second coupling layer may be an adhesive bonding layer comprised of an insulating material, a semiconductor material, a metal material or an organic material.

Optionally, the first surface of the first substrate and the third surface of the second substrate may be bonded to each other by a direct-bonding process.

Optionally, the first substrate further may further include a self-test electrode, with a position of the self-test electrode corresponding to a position of the sensitive region after the first surface of the first substrate and the third surface of the second substrate are bonded to each other.

Optionally, a fourth conductive plug may be formed from the side of the second surface of the first substrate, with the fourth conductive plug passing through to at least one of the conductive layers.

Accordingly, a method for forming a Micro-Electro-Mechanical System (MEMS) microphone is further provided according to the present disclosure, and the method includes: providing a first substrate, where the first substrate includes a first surface and a second surface opposite to the first surface, the first substrate includes at least one conductive layer located at the side of the first surface of the first substrate; providing a second substrate, where the second substrate includes a third surface and a fourth surface opposite to the third surface, the second substrate includes a second base and a sensitive electrode located on or above or in the second base, the second substrate includes a sensitive region in which the sensitive electrode is located, the sensitive electrode is located at the side of the third surface of the second substrate; bonding the first surface of the first substrate and the third surface of the second substrate to each other; thinning the second substrate from the fourth surface of the second substrate and removing the second base partially to form a fifth surface opposite to the third surface of the second substrate after the first surface of the first substrate and the third surface of the second substrate are bonded to each other; forming a cavity between the first substrate and the sensitive region of the second substrate; and forming a first conductive plug from the side of the fifth surface of the second substrate, with the first conductive plug passing through to at least one of the conductive layers, where the first conductive plug is used to form an electrical connection between the conductive layer and the sensitive electrode.

Optionally, the method for forming the MEMS microphone may further include: forming a fixed electrode, where the fixed electrode is located at the side of the third surface of the second substrate; a position of the fixed electrode corresponding to a position of the sensitive electrode after the first surface of the first substrate and the third surface of the second substrate are bonded to each other; and forming a cavity between the fixed electrode and the sensitive electrode.

Optionally, in a case that the sensitive electrode is located on or above the second base, the method may further include etching the second base to form a fixed electrode after second substrate is thinned from the fourth surface of the second substrate.

Optionally, the method for forming the MEMS microphone may further include: forming a first electrode layer, where the first electrode layer includes the sensitive electrode; or forming a second electrode layer, where the second electrode layer includes the fixed electrode; and forming a stopper, where the stopper is located between the second base and the first electrode layer or between the second base and the second electrode layer, with a position of the stopper corresponding to a position of the sensitive region.

Optionally, the forming the second substrate may include: providing a semiconductor on insulator substrate, where the semiconductor on insulator substrate includes a base, an insulating layer on a surface of the base, and a semiconductor layer on a surface of the insulating layer; etching the semiconductor layer to form the fixed electrode or the sensitive electrode; and providing the second base as the base.

Optionally, in a case that the sensitive electrode is located on or above the second base, the method may further include forming a third opening at the side of the fifth surface of the second substrate, with a position of the third opening corresponding to a position of the sensitive region.

Optionally, at least one fifth through hole passing through the second base may be formed at the side of the fifth surface of the second substrate, with a position of the fifth through hole corresponding to a position of the sensitive region.

Optionally, in a case that the sensitive electrode is located in the second base, the method may further include etching the second base to form the sensitive electrode after the second substrate is thinned from the fourth surface of the second substrate.

Optionally, the method for forming the MEMS microphone may further include: forming a second opening in the first substrate; and a position of the second opening corresponding to a position of the sensitive region of the second substrate after the first surface of the first substrate and the third surface of the second substrate are bonded to each other.

Optionally, the second opening may be located at the side of the first surface of the first substrate; or the second opening may pass through the first substrate.

Optionally, the method for forming the MEMS microphone may further include forming a material layer at the side of the third surface of the second substrate, where the second substrate further includes a first electrode layer located on or above the second base, the first electrode layer includes the sensitive electrode, and the material layer is located between the first electrode layer and the first substrate after the first surface of the first substrate and the third surface of the second substrate are bonded to each other.

Optionally, the first substrate may further include a circuit.

Optionally, the second substrate may further include a second coupling layer located at the side of the third surface, or the first substrate may include a first coupling layer located at the side of the first surface; or the second substrate may further include a second coupling layer located at the side of the third surface, and the first substrate may include a first coupling layer located at the side of the first surface.

Optionally, at least one of the first coupling layer and the second coupling layer may be comprised of an insulating material.

Optionally, the first surface of the first substrate and the third surface of the second substrate may be bonded to each other by an adhesive bonding process; and the first coupling layer or the second coupling layer may be an adhesive bonding layer comprised of an insulating material, a semiconductor material, a metal material or an organic material.

Optionally, the first surface of the first substrate and the third surface of the second substrate may be bonded to each other by a direct-bonding process.

Optionally, the first substrate may further include a self-test electrode, with a position of the self-test electrode corresponding to a position of the sensitive region after the first surface of the first substrate and the third surface of the second substrate are bonded to each other.

Optionally, a fourth conductive plug from the side of the second surface of the first substrate may be formed, with the fourth conductive plug passing through to at least one of the conductive layers.

Accordingly, a Micro-Electro-Mechanical System (MEMS) microphone is further provided according to the present disclosure, and the MEMS microphone includes: a first substrate, where the first substrate includes a first surface and a second surface opposite to the first surface, the first substrate includes at least one conductive layer located at the side of the first surface of the first substrate; a second substrate, where the second substrate includes a third surface and a fifth surface opposite to the third surface, the second substrate includes a sensitive electrode, the second substrate includes a sensitive region in which the sensitive electrode is located, the first surface of the first substrate and the third surface of the second substrate are bonded to each other; a cavity located between the first substrate and the sensitive region of the second substrate; and a first conductive plug formed from the side of the fifth surface of the second substrate and passing through to at least one of the conductive layers, where the first conductive plug is used to form an electrical connection between the conductive layer and the sensitive electrode.

Optionally, the MEMS microphone may further include: a fixed electrode, where the fixed electrode is located at the side of the first surface of the first substrate or at the side of the third surface of the second substrate, with a position of the fixed electrode corresponding to a position of the sensitive electrode after the first surface of the first substrate and the third surface of the second substrate are bonded to each other; and a cavity located between the fixed electrode and the sensitive electrode.

Optionally, the second substrate may further include a first electrode layer including the sensitive electrode; the first substrate or the second substrate may further include a second electrode layer including the fixed electrode; and the MEMS microphone may further include a stopper located between the first electrode layer and the second electrode layer, with a position of the stopper corresponding to a position of the sensitive region.

Optionally, the MEMS microphone may further include a second opening in the first substrate, with a position of the second opening corresponding to a position of the sensitive region of the second substrate.

Optionally, the second opening may be located at the side of the first surface of the first substrate; or the second opening may pass through the first substrate.

Optionally, the MEMS microphone may further include a material layer located at the side of the third surface of the second substrate, where the second substrate may further include a first electrode layer located on or above the second base, the first electrode layer may include the sensitive electrode, and the material layer may be located between the first electrode layer and the first substrate.

Optionally, the first substrate may further include a circuit.

Optionally, the second substrate may further include a second coupling layer located at the side of the third surface, or the first substrate may include a first coupling layer located at the side of the first surface; or the second substrate may further include a second coupling layer located at the side of the third surface, and the first substrate may include a first coupling layer located at the side of the first surface.

Optionally, at least one of the first coupling layer and the second coupling layer may be comprised of an insulating material.

Optionally, the first coupling layer or the second coupling layer may be an adhesive bonding layer comprised of an insulating material, a semiconductor material, a metal material or an organic material.

Optionally, the first coupling layer or the second coupling layer may be a bonding layer; or the first coupling layer and the second coupling layer may be bonding layers.

Optionally, the first substrate may further include a self-test electrode, with a position of the self-test electrode corresponding to a position of the sensitive region.

Optionally, the MEMS microphone may further include a fourth conductive plug formed from the side of the second surface of the first substrate and passing through to at least one of the conductive layers.

Accordingly, a Micro-Electro-Mechanical System (MEMS) microphone is further provided according to the present disclosure, and the MEMS microphone includes: a first substrate, where the first substrate includes a first surface and a second surface opposite to the first surface, the first substrate includes at least one conductive layer located at the side of the first surface of the first substrate; a second substrate, where the second substrate includes a third surface and a fifth surface opposite to the third surface, the second substrate includes a second base and a sensitive electrode located on or above or in the second base, the second substrate includes a sensitive region in which the sensitive electrode is located, the first surface of the first substrate and the third surface of the second substrate are bonded to each other; a cavity located between the first substrate and the sensitive region of the second substrate; and a first conductive plug formed from the side of the fifth surface of the second substrate and passing through to at least one of the conductive layers, where the first conductive plug is used to form an electrical connection between the conductive layer and the sensitive electrode.

Optionally, the MEMS microphone may further include: a fixed electrode, where the fixed electrode is located at the side of the third surface of the second substrate, with a position of the fixed electrode corresponding to a position of the sensitive electrode; and a cavity located between the fixed electrode and the sensitive electrode.

Optionally, the fixed electrode may be located in the second base in a case that the sensitive electrode is located on or above the second base.

Optionally, the second substrate may further include a first electrode layer located on or above the second base, with the first electrode layer including the sensitive electrode; the first substrate or the second substrate may further include a second electrode layer including the fixed electrode; and the MEMS microphone may further include a stopper located between the first electrode layer and the second electrode layer, with a position of the stopper corresponding to a position of the sensitive region.

Optionally, in a case that the sensitive electrode is located on or above the second base, the MEMS microphone may further include a third opening located at the side of the fifth surface of the second substrate, with a position of the third opening corresponding to a position of the sensitive region.

Optionally, the MEMS microphone may further include at least one fifth through hole located at the side of the fifth surface of the second substrate and passing through the second base, with a position of the fifth through hole corresponding to a position of the sensitive region.

Optionally, the MEMS microphone may further include a second opening in the first substrate, with a position of the second opening corresponding to a position of the sensitive region of the second substrate.

Optionally, the second opening may be located at the side of the first surface of the first substrate; or the second opening may pass through the first substrate.

Optionally, the MEMS microphone may further include a material layer located at the side of the third surface of the second substrate, where the second substrate may further include a first electrode layer located on or above the second base, the first electrode layer may include the sensitive electrode, and the material layer may be located between the first electrode layer and the first substrate.

Optionally, the first substrate may further include a circuit.

Optionally, the second substrate may further include a second coupling layer located at the side of the third surface, or the first substrate may include a first coupling layer located at the side of the first surface; or the second substrate may further include a second coupling layer located at the side of the third surface, and the first substrate may include a first coupling layer located at the side of the first surface.

Optionally, at least one of the first coupling layer and the second coupling layer may be comprised of an insulating material.

Optionally, the first coupling layer or the second coupling layer may be an adhesive bonding layer comprised of an insulating material, a semiconductor material, a metal material or an organic material.

Optionally, the first coupling layer or the second coupling layer may be a bonding layer; or the first coupling layer and the second coupling layer each may be bonding layers.

Optionally, the first substrate may further include a self-test electrode, with a position of the self-test electrode corresponding to a position of the sensitive region.

Optionally, the MEMS microphone may further include a fourth conductive plug formed from the side of the second surface of the first substrate and passing through to at least one of the conductive layers.

Compared with the conventional art, the technical solution according to the present disclosure has the following advantages.

In the method for forming the MEMS microphone according to the present disclosure, the first substrate including the conductive layer and the second substrate including the sensitive electrode are provided. The conductive layer is located at the side of the first surface of the first substrate, and the sensitive electrode is located at the side of the third surface of the second substrate. The first surface of the first substrate and the third surface of the second substrate are bonded to each other to form a stacked structure of the first substrate and the second substrate. The conductive layer may be used to transmit the electrical signal outputted from the sensitive electrode. To form an electrical connection between the conductive layer and the sensitive electrode, a first conductive plug is formed from the side of the fifth surface of the second substrate after the second base is removed to form the fifth surface opposite to the third surface, with the first conductive plug passing through to the conductive layer. Because the first conductive plug is exposed through the fifth surface of the second substrate, it is easy to form a first conductive structure electrically connected to a top of the first conductive plug and the sensitive electrode, thereby realizing the electrical connection between the sensitive electrode and the conductive layer.

The conductive layer is formed in the first substrate, the sensitive electrode is formed in the second substrate, and the first surface of the first substrate and the third surface of the second substrate are bonded to each other to form a stacked structure of the first substrate and the second substrate, thereby avoiding forming the conductive layer, the fixed electrode, the sensitive electrode corresponding to the fixed electrode, and the cavity located between the sensitive electrode and the fixed electrode on or above the same base layer by layer, and thus reducing the process difficulty. Moreover, the process temperature limitations in a manufacturing process for the second substrate due to the first substrate are avoided, thereby widening the selection of materials and processes of the second substrate and the sensitive electrode in the second substrate, and improving the sensitivity of the formed sensitive electrode.

The first surface of the first substrate is or may be in direct contact with the third surface of the second substrate, thus a contact area between the first surface and the third surface is large, so that the support strength between the first substrate and the second substrate is greater, the stack of the first substrate and the second substrate is therefore more resistant to bending, cracking or deforming, and the formed microphone has a more stable structure and improved durability.

Further, with the above-described method, a distance from the fourth surface of the second substrate to the second surface of the first substrate is short, which is beneficial to decrease the size of the formed microphone and reduce the manufacturing cost.

Moreover, since the electrical connection between the conductive layer and the sensitive electrode is achieved by forming the first conductive plug from the side of the fifth surface of the second substrate, with the first conductive plug passing through to the conductive layer, no additional conductive layer is needed between the first surface of the first substrate and the third surface of the second substrate, thereby preventing a stress from being generated between the first surface and the third surface by the additional conductive layer and thus affecting the performance of the sensitive electrode and the conductive layer. Moreover, the material of the first surface of the first substrate and the material of the third surface of the second substrate are not limited by process, preventing a thermal expansion coefficient mismatch between the material of the first surface and the material of the third surface from being too large, therefore stabilizing the performance of the formed microphone. Moreover, the flexibility of a process for forming the first substrate and the second substrate is higher, and thus the manufacturing process for the microphone can be more generally applied, which is more beneficially compatible with other manufacture procedure for integrating the conductive layers, and reducing the manufacturing cost.

Since the conductive layer is electrically connected to the sensitive electrode via the first conductive plug, there is no need to use a wire bonding lead to provide an electrical connection between the first substrate and the second substrate, thereby improving microphone's capacity to resist external interference, lowering a technical requirement for package process and reducing the manufacturing cost.

Further, the fixed electrode is formed at the side of the first surface of the first substrate or at the side of the third surface of the second substrate, and the formed cavity is located between the sensitive electrode and the fixed electrode. The sensitive electrode, the fixed electrode and the cavity form a capacitor. A capacitance of the capacitor may be changed and an electrical signal changing with the sound is outputted when the sensitive electrode is vibrated by the sound wave.

Further, the first substrate includes a circuit. The circuit can process the electrical signal outputted from the sensitive electrode since the first substrate and the second substrate are stacked together.

Further, a semiconductor on insulator substrate is provided to form the second substrate. The sensitive electrode may be formed by etching a semiconductor layer in the semiconductor on insulator substrate. The sensitive electrode may have a deformation due to the vibration of a sound wave, so as to cause a change in the capacitance between sensitive electrode and the fixed electrode, and output the electrical signal in relation to the sound. The semiconductor in the semiconductor on insulator substrate is comprised of a single crystal semiconductor material, and the sensitive electrode formed by the single crystal semiconductor material doped with ions has a high sensitivity, thereby improving the sensitivity and the durability of the formed sensitive electrode.

Further, in a case that the fixed electrode is located at the side of the first surface of the first substrate, the first opening is formed at the side of the third surface of the second substrate, or at the side of the first surface of the first substrate, or both at the side of the first surface and at the side of the third surface. The cavity located between the sensitive electrode and the fixed electrode may be formed by the first opening and the first surface of the first substrate after the first surface of the first substrate and the third surface of the second substrate are bonded to each other. The bonded first substrate and second substrate has a small total thickness and a high mechanical strength and thus the formed microphone has a better performance, since the first surface and the third surface are in a large-area contact except a position of the first opening. Moreover, the process for forming the cavity is simple and the size of the cavity is easy to control.

Further, the first substrate further includes the self-test electrode. A position of the self-test electrode corresponds to a position of the sensitive electrode after the first surface of the first substrate and the third surface of the second substrate are bonded to each other. The self-test electrode may apply an electrostatic attraction to the sensitive electrode to detect whether the sensitive electrode has a change in the capacitance due to the deformation, thereby detecting whether the sensitive electrode operates normally.

In another forming method according to the present disclosure, the first substrate including the conductive layer and the second substrate including the sensitive electrode are provided; and the first surface of the first substrate and the third surface of the second substrate are bonded to each other to form a stacked structure of the first substrate and the second substrate. The conductive layer may be used to transmit the electrical signal outputted from the sensitive electrode. To form an electrical connection between the conductive layer and the sensitive electrode, a first conductive plug is formed from the side of the fifth surface of the second substrate after the second base is partially thinned and the fifth surface is formed, with the first conductive plug passing through to the conductive layer. The first conductive plug is exposed through the fifth surface of the second substrate, and it is easy to form a first conductive structure electrically connected to a top of the first conductive plug and the sensitive electrode, thereby realizing the electrical connection between the sensitive electrode and the conductive layer. The stack of the first substrate and the second substrate have a greater mechanical strength and thus the formed microphone has a more stable structure and improved durability, since the first surface and the third surface are in a large-area contact. Further, a distance from the fourth surface of the second substrate to the second surface of the first substrate is short, so that the formed microphone has a small size. Moreover, the material of the first surface and the material of the third surface are not limited by process, preventing a thermal expansion coefficient mismatch between the material of the first surface and the material of the third surface from being too large, so that the formed microphone has a more stable performance.

Further, the third opening is formed at the side of the fifth surface of the second substrate and a position of the third opening corresponds to a position of the sensitive region in a case that both the sensitive electrode and the fixed electrode are located on or above the second base. Since a region except the sensitive region is covered by the second base, a distance from the sensitive electrode to an external environment is increased while an external sound wave is obtained by the sensitive electrode, thereby preventing the sensitive electrode and a protective layer on a surface of the sensitive electrode from being worn or other damages.

A structure according to the present disclosure has the first substrate including the conductive layer and the second substrate including the sensitive electrode. The conductive layer is located at the side of the first surface of the first substrate. The first surface of the first substrate and the third surface of the second substrate are bonded to each other. Thus, the first substrate and the second substrate are stacked together. The conductive layer is used to transmit the electrical signal outputted from the sensitive electrode. A first conductive plug passes through to the conductive layer from the fifth surface of the second substrate, and an electrical connection is formed between the conductive layer and the sensitive electrode by the first conductive plug and the first conductive structure. A contact area between the first surface and the third surface is large, so that the bonded first substrate and second substrate has a high mechanical strength and the formed microphone has a more stable structure and improved durability. Further, a distance from the fifth surface of the second substrate to the second surface of the first substrate is short, so that the formed microphone has a small size. Moreover, the material of the first surface and the material of the third surface are not limited by process, thereby preventing a thermal expansion coefficient mismatch between the material of the first surface and the material of the third surface from being too large, so that the formed microphone has a more stable performance.

A structure according to the present disclosure has the first substrate including the conductive layer and the second substrate including the second base and the sensitive electrode located on or above the second base. The conductive layer is located at the side of the first surface of the first substrate, and the sensitive electrode is located at the side of the third surface of the second substrate. The first surface of the first substrate and the third surface of the second substrate are bonded to each other. Thus, the first substrate and the second substrate are stacked. The conductive layer is used to transmit the electrical signal outputted from the sensitive electrode. The second base can protect the sensitive electrode since the second base is located at the side of the fifth surface of the second substrate. The first conductive plug passes through to the conductive layer from the fifth surface of the second substrate, and an electrical connection is formed between the conductive layer and the sensitive electrode by the first conductive plug and the first conductive structure. A contact area between the first surface and the third surface is large, so that the bonded first substrate and second substrate has a high mechanical strength and the formed microphone has a more stable structure and improved durability. Further, there is not too much gaps between the first surface of the first substrate and the third surface of the second substrate, and the distance from the fifth surface of the second substrate to the second surface of the first substrate is short, so that the formed microphone has a small size. Moreover, the material of the first surface and the material of the third surface are not limited by process, thereby preventing a thermal expansion coefficient mismatch between the material of the first surface and the material of the third surface from being too large, so that the formed microphone has a more stable performance.

DETAILED DESCRIPTION OF THE EMBODIMENTS

Figure 1:
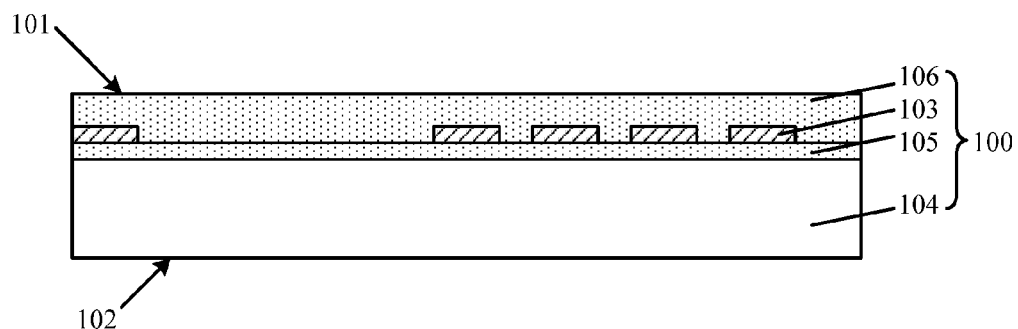
FIG. 1 to FIG. 10 are schematic sectional views of a structure of a MEMS microphone during a forming process according to an embodiment of the present disclosure.

As described in Background, in the conventional method for manufacturing an MEMS microphone, a process for integrating a microphone chip and a processing circuit is complex, and the formed device has a large size.

In a conventional method of manufacturing the MEMS microphone, the microphone chip and a signal processing circuit chip are manufactured separately. The microphone chip and the signal processing circuit chip are disposed on a package substrate, and the microphone chip and the signal processing circuit chip are connected via a wire bonding lead. Then, the signal processing circuit chip is coated with a protection gel to surround the signal processing circuit chip. Then, a metal cap is disposed outside the protection gel for sealing. In another conventional method, the microphone chip and the signal processing chip may be disposed on a planar package substrate, connected via a wire bonding lead, and then covered by the metal gap.

However, in the above-described process for manufacturing the MEMS microphone, the microphone chip and the signal processing circuit chip are discrete and are arranged parallel to a surface of the package substrate, so that the formed MEMS microphone has a large size, and thus requirements of integration and miniaturization of the MEMS microphone are not met. Moreover, after being disposed on the package substrate, the microphone chip and the signal processing circuit chip need to be partly covered by protection gel, and then need to be protected by a metallized plastic gap or a metal gap, therefore the process technology is complex, and it is not compatible with a wider range of integrated circuit manufacturing processes. Since the two chips are connected via the wire bonding lead, the formed MEMS microphone may be more vulnerable to external interference. Thus, the metal gap is needed to cover the microphone chip and the signal processing circuit chip, thereby increasing the manufacturing cost.

In view of the above, an MEMS microphone and a method for forming the MEMS microphone are provided according to the present disclosure. In this method, a first substrate including a conductive layer and a second substrate including a sensitive electrode are provided. The conductive layer is located at the side of the first surface of the first substrate, and the sensitive electrode is located at the side of the third surface of the second substrate. The first surface of the first substrate and the third surface of the second substrate are bonded to each other to form a stacked structure of the first substrate and the second substrate. The conductive layer may be used to transmit the electrical signal outputted from the sensitive electrode. To form an electrical connection between the conductive layer and the sensitive electrode, a first conductive plug is formed from the fifth surface of the second substrate after the second base is removed and the fifth surface opposite to the third surface is formed, with the first conductive plug passing through to the conductive layer. Because the first conductive plug is exposed through the fifth surface of the second substrate, it is easy to form a first conductive structure electrically connected to a top of the first conductive plug and the sensitive electrode, thereby realizing the electrical connection between the sensitive electrode and the conductive layer.

The conductive layer is formed in the first substrate, the sensitive electrode is formed in the second substrate, and the first surface of the first substrate and the third surface of the second substrate are bonded to each other to form a stacked structure of the first substrate and the second substrate, thereby avoiding forming the conductive layer, the fixed electrode, the sensitive electrode corresponding to the fixed electrode, and the cavity located between the sensitive electrode and the fixed electrode on or above the same base layer by layer, and thus reducing the process difficulty. Moreover, the process temperature limitations in a manufacturing process for the second substrate due to the second substrate are avoided, thereby widening a selection of materials and processes of the second substrate and the sensitive electrode in the second substrate, and improving the sensitivity of the formed sensitive electrode.

The first surface of the first substrate is or may be in direct contact with the third surface of the second substrate, thus a contact area between the first surface and the third surface is large, so that a support strength between the first substrate and the second substrate is greater, the stack of the first substrate and the second substrate is therefore more resistant to bending, cracking or deforming, and the formed microphone has a more stable structure and improved durability.

Further, with the above-described method, a distance from the fourth surface of the second substrate to the second surface of the first substrate is short, which is beneficial to decrease the size of the formed microphone and reduce the manufacturing cost.

Moreover, since the electrical connection between the conductive layer and the sensitive electrode is achieved by forming the first conductive plug from the side of the fifth surface of the second substrate, with the first conductive plug passing through to the conductive layer, no additional conductive layer is needed between the first surface of the first substrate and the third surface of the second substrate, thereby preventing an additional stress from being generated between the first surface and the third surface by the additional conductive layer and thus affecting the performance of the sensitive electrode and the conductive layer. Moreover, the material of the first surface of the first substrate and the material of the third surface of the second substrate are not limited by process, thereby preventing a thermal expansion coefficient mismatch between the material of the first surface and the material of the third surface from being too large, and stabilizing the performance of the formed microphone. Moreover, the flexibility of a process for forming the first substrate and the second substrate is higher, and thus the manufacturing process for the microphone can be applied easily, which is beneficial to be compatible with other manufacture procedure for integrating the conductive layers, and reducing the manufacturing cost.

Since the conductive layer is electrically connected to the sensitive electrode via the first conductive plug, there is no need to use a wire bonding lead to provide an electrical connection between the first substrate and the second substrate, thereby improving the capacity of resisting external interference of the formed microphone, lowering a technical requirement for package process and reducing the manufacturing cost.

To make the above features and advantages of the disclosure more apparent and easier to be understood, specific embodiments of the disclosure are illustrated hereinafter in detail in conjunction with the drawings.

First Embodiment

FIG. 1 to FIG. 9 are schematic sectional views of a structure of an MEMS microphone during a forming process according to an embodiment of the present disclosure.

Referring to FIG. 1, a first substrate 100 is provided. The first substrate 100 includes a first surface 101 and a second surface 102 opposite to the first surface 101. The first substrate 100 includes at least one conductive layer 103 located at the side of the first surface 101 of the first substrate 100.

The first substrate 100 is used to form the conductive layer 103, and the conductive layer 103 is used to transmit electrical signal outputted from the sensitive electrode.

In the embodiment, the first substrate 100 includes a first base 104, a first dielectric layer 105 located on a surface of the first base 104, and the conductive layer 103 located on a surface of the first dielectric layer 105. The first substrate 100 further includes a first coupling layer 106 located at the side of the first surface 101. In the embodiment, the first surface 101 is a surface of the first coupling layer 106. In the embodiment, the conductive layer 103 has a single-layer structure. In another embodiment, the conductive layer may have a multi-layer structure, and thus a first conductive plug formed subsequently is connected to at least one of the conductive layers. In another embodiment, the first substrate 100 may not include the first coupling layer 106.

The first base 104 may be a silicon substrate, a silicon germanium substrate, a silicon carbide substrate, a glass substrate or an III-V group compound substrate (such as a gallium nitride substrate or a gallium arsenide substrate).

The first dielectric layer 105 is used to electrically isolate the conductive layer 103 from the first base 104. The first dielectric layer 105 is comprised of a silicon oxide, a silicon nitride, a silicon oxynitride, a low-k dielectric material (a material with a dielectric constant ranging from 2.5 to 3.9) or an ultra-low-k dielectric material (a material with a dielectric constant less than 2.5). A process for forming the first dielectric layer 105 includes an oxidation process, a chemical vapor deposition process, a physical vapor deposition process or an atomic layer deposition process.

The conductive layer 103 is comprised of a conductive material, including metal, a metal compound or a semiconductor material doped with ions. Forming the conductive layer 103 includes: depositing a conductive material layer on the surface of the first dielectric layer 105; forming a patterned layer on a surface of the conductive material layer, where a part of the surface of the conductive material layer is exposed through the patterned layer; and etching the conductive material layer by using the patterned layer as a mask, until the surface of the first dielectric layer 105 is exposed. A process for forming the conductive material layer includes a chemical vapor deposition process, a physical vapor deposition process or an atomic layer deposition process. The patterned layer includes a patterned photoresist layer. A process for etching the conductive material layer includes a dry etching process.

In an embodiment, the first substrate 100 further includes a fixed electrode, and the fixed electrode is located at the side of the first surface 101 of the first substrate 100. When the first surface 101 of the first substrate 100 and the third surface of the second substrate are bonded to each other, the fixed electrode and the sensitive electrode are disposed correspondingly to each other, and a cavity is formed between the sensitive electrode and the fixed electrode, so that the sensitive electrode, the fixed electrode and the cavity form a microphone structure, whose electrical output changes in response to a sound wave received by the sensitive electrode. In the embodiment, the fixed electrode is formed in the second substrate.

The first coupling layer 106 is used to protect the conductive layer 103, and the first coupling layer 106 and a second coupling layer on a surface of the second substrate are bonded to each other so as to bond the first substrate 100 and the second substrate to each other. The first coupling layer 106 has a flat surface, that is, the first surface 101 of the first substrate 100 is flat, and a third surface of the second substrate to be provided subsequently is also flat. Thus, after the first surface 101 of the first substrate 100 and the third surface of the second substrate are bonded to each other, a contact area between the first surface 101 and the third surface is large, and thus a stacked structure formed by the first surface 101 and the second substrate has a high strength and a stable coupling.

The first coupling layer 106 is comprised of an insulating material, a metal material, a metal compound material, a semiconductor material or any combination thereof. The insulating material includes silicon oxide, silicon nitride, silicon oxynitride, a low-k dielectric material or an ultra-low-k dielectric material. The metal material includes one or more of copper, tungsten, aluminum, silver, titanium and tantalum. The metal compound material includes one or both of titanium nitride and tantalum nitride. The semiconductor material includes one or more of polycrystalline silicon, amorphous silicon, polycrystalline germanium, amorphous germanium, silicon germanium and silicon carbide doped with ions. The doping ion includes one or more of a p-type ion, an n-type ion, a carbon ion, a nitrogen ion, a fluoride ion and a hydrogen ion.

In an embodiment, the first coupling layer 106 is comprised of silicon oxide. Forming the first coupling layer includes: depositing a first coupling film on surfaces of the first dielectric layer 105 and the conductive layer 103; and flattening the first coupling film by a chemical mechanical polishing process, to form the first coupling layer 106.

In another embodiment, the first substrate 100 may not include the first coupling layer, and the second substrate to be provided subsequently may include a second coupling layer.

Further, the first substrate 100 includes a circuit including a semiconductor device structure and an electrical interconnection structure. The conductive layer 103 may be a conductive layer of the circuit, or may be a conductive layer added to the circuit. The conductive layer 103 may be a conductor or a semiconductor.

In the embodiment, a second substrate is provided. The second substrate includes a third surface and a fourth surface opposite to the third surface. The second substrate includes a second base and a sensitive electrode located on or above the second base, and the sensitive electrode is located at the side of the third surface of the second substrate. A forming process of the second substrate will be explained below.

Figure 2:
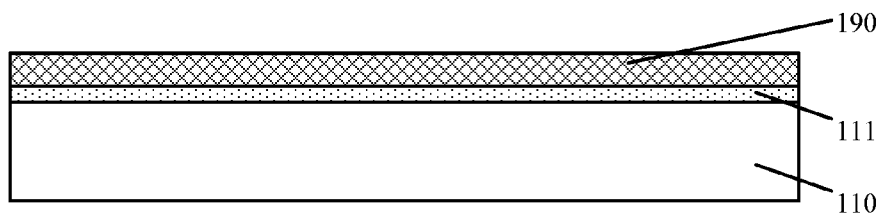

Referring to FIG. 2, it is provided a second base 110, a protective layer 111 located on a surface of the second base 110 and a second electrode layer 190 located on a surface of the protective layer 111.

In the embodiment, the second electrode layer 190 is used to form a fixed electrode and then form a sensitive electrode on or above the second electrode layer 190. The fixed electrode and the sensitive electrode form a microphone structure.

In an embodiment, the second base 110, the protective layer 111 and the first electrode layer 112 are formed by a semiconductor on insulator substrate. Specifically, the semiconductor on insulator substrate is provided, which includes a base, an insulating layer located on a surface of the base, and a semiconductor layer located on a surface of the insulating layer. The base is the second base 110, the insulating layer is the protective layer 111; and the semiconductor layer is the second electrode layer 190. In another embodiment, the semiconductor layer is the first electrode layer, and the first electrode layer is used to form the sensitive electrode.

The semiconductor on insulator substrate includes a silicon on insulator substrate. The protective layer 111 is comprised of a silicon oxide, which is a buried oxide layer (BOX). The semiconductor layer is comprised of a single crystal silicon or a single crystal germanium. Since the semiconductor layer is comprised of a single crystal semiconductor material, the capacitance of the capacitor including the sensitive electrode is changed due to a deformation of the sensitive electrode, and the performance of the formed sensitive electrode is more stable and reliable. Moreover, the semiconductor layer of the semiconductor on insulator substrate is used as the first electrode layer or the second electrode layer 190, and the insulating layer is used as the protective layer 111. Thus, it is not needed to form the protective layer 111 and the first electrode layer or the second electrode layer 190 using an additional deposition process, thereby simplifying the process technology.

In another embodiment, the second base 110 is a body substrate, which may be a silicon substrate, a silicon germanium substrate, a silicon carbide substrate, a glass substrate or an III-V group compound substrate (such as a gallium nitride substrate or a gallium arsenide substrate).

The protective layer 111 and the second electrode layer 190 are formed by a deposition process, including a physical vapor deposition process, a chemical vapor deposition process or an atomic layer deposition process. The protective layer 111 is comprised of an insulating material, including silicon oxide, silicon nitride, silicon oxynitride, a low-k dielectric material or an ultra-low-k dielectric material. The second electrode layer 190 is comprised of a semiconductor material, including polycrystalline silicon, amorphous silicon, polycrystalline germanium, amorphous germanium, silicon carbide, gallium arsenide or silicon germanium. The second electrode layer 190 may also be comprised of metal or a metal compound, including one or more of copper, tungsten, aluminum, silver, titanium, tantalum, titanium nitride and tantalum nitride.

Since the second base 110 is the body base, and the protective layer 111 and the second electrode layer 190 are formed by a deposition process, a selection of a material of the second base 110, the protective layer 111 and the second electrode layer 190 is widen, thereby easier to meet requirements for more process flows and technologies.

Figure 3:
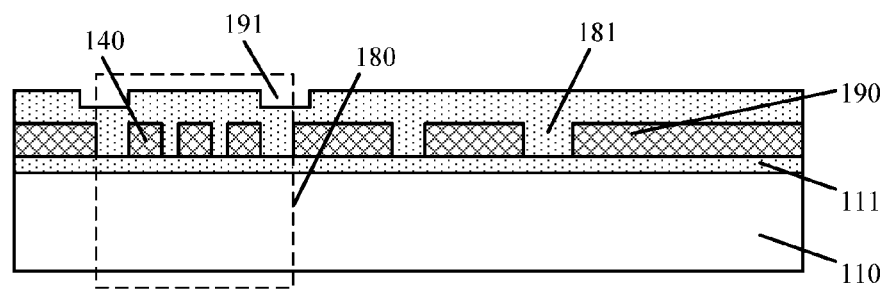

Referring to FIG. 3, the second electrode layer 190 (as shown in FIG. 2) is etched, to form a fixed electrode 140.

In the embodiment, the second substrate includes the second base 110, the protective layer 111 and the second electrode layer 190. The fixed electrode 140 may be formed in a sensitive region 180 of the second substrate by etching the second electrode layer 190. A second electrode interconnection layer may also be formed by etching the second electrode layer 190. The second electrode interconnection layer is electrically interconnected with the fixed electrode 140. The sensitive region 180 of the second substrate forms a sensitive film. To make the fixed electrode 140 not prone to deformation by the sound wave, several grooves or through holes are formed in the formed fixed electrode 140. These grooves or through holes pass through the second electrode layer 190. After a cavity is formed between the fixed electrode 140 and the sensitive electrode, air may pass through the fixed electrode 140 and contact with the sensitive electrode. Air vibration from the sound wave results in no or very low deformation of the fixed electrode 140 but much more or higher deformation of the sensitive electrode. The several grooves or through holes in the fixed electrode 140 may be used as openings in a subsequent etching process for forming the cavity.

Forming the fixed electrode 104 includes: forming a first patterned layer on a surface of the second electrode layer 190, where a part of the surface of the second electrode layer 190 is exposed through the first patterned layer; etching the second electrode layer 190 by using the first patterned layer as a mask, until the surface of the protective layer 111 is exposed, to form the fixed electrode 104; and removing the first patterned layer after the second electrode layer 190 is etched.

The first patterned layer is a patterned photoresist layer formed by a photolithography process. The first patterned layer may also be a mask formed by a multiple patterning masking process, such as a self-aligned double patterning (abbreviated as SADP) mask. A process for removing the first pattered layer includes a dry etching process or a wet etching process.

A process for etching the second electrode layer 190 is a dry etching process which is anisotropic. In the embodiment, the second electrode layer 190 is etched until the surface of the protective layer 111 is exposed.

In the embodiment, the fixed electrode 140 and the sensitive electrode formed are used to form a microphone structure. The fixed electrode 140 is not prone to deformation by the sound wave, and the sensitive electrode is prone to deformation by the sound wave, thereby causing change in the capacitance between the sensitive electrode and the fixed electrode 140 and thus causing change in the outputted electrical signal.

In the embodiment, after the fixed electrode 140 is formed, the method further includes: forming a second dielectric layer 181 on surfaces of the second electrode layer 190, and subsequently forming the sensitive electrode on a surface of the second dielectric layer 181. The second dielectric layer 181 is formed by a deposition process, including a physical vapor deposition process, a chemical vapor deposition process or an atomic layer deposition process. The second dielectric layer 181 is comprised of an insulating material, including a silicon oxide, a silicon nitride, a silicon oxynitride, a low-k dielectric material or an ultra-low-k dielectric material.

In the embodiment, a stopper groove 191 is further formed in the second dielectric layer 181 and is used to form a stopper. The stopper is located between the first electrode layer and the second electrode layer 190, and a position of the stopper corresponds to a position of a sensitive region 180.

Forming the stopper groove 191 includes: forming a patterned layer on the surface of the second dielectric layer 181, where a corresponding area of the surface of the second dielectric layer 181 to form the stopper groove 191 is exposed through the patterned layer; and etching the second dielectric layer 181 by using the patterned layer as a mask, to form the stopper groove 191. A process for etching the second dielectric layer 181 may be a dry etching process or a wet etching process.

Figure 4:
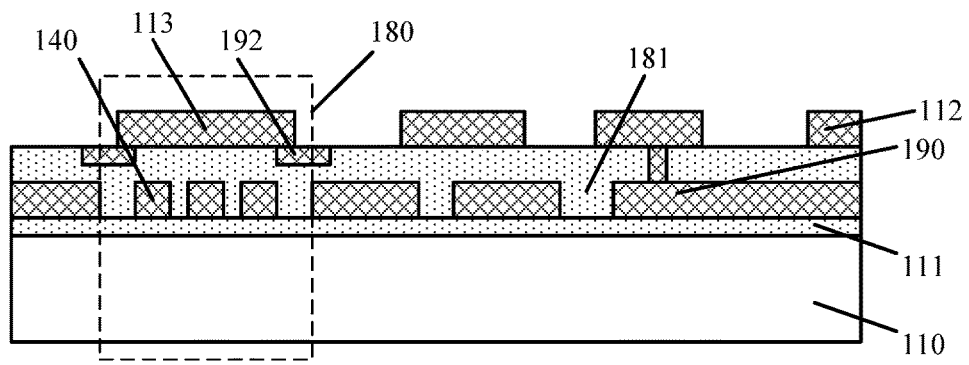

Referring to FIG. 4, a sensitive electrode 113 is formed on or above the second electrode layer 190.

Forming the sensitive electrode 113 includes: forming the first electrode layer 112 on the surface of the second dielectric layer 181; and etching the first electrode layer 112 to form the sensitive electrode 113. The formed sensitive electrode 113 is located in the sensitive region 180 of the second substrate. A first electrode interconnection layer may also be formed by etching the first electrode layer 112, and the first electrode interconnection layer is electrically interconnected with the sensitive electrode 113. In the embodiment, a conductive plug is formed in the second dielectric layer 181 between the first electrode interconnection layer and the second electrode interconnection layer for electrical connection.

Etching the first electrode layer 112 includes: forming a second patterned layer on a surface of the first electrode layer 112, where a part of the surface of the first electrode layer 112 is exposed through the second patterned layer; and etching the first electrode layer 112 by using the second patterned layer as a mask, until the surface of the second dielectric layer 181 is exposed, to form the sensitive electrode 113.

The first electrode layer 112 is formed by a deposition process, including a physical vapor deposition process, a chemical vapor deposition process or an atomic layer deposition process. The first electrode layer 112 is comprised of a semiconductor material, including polycrystalline silicon, amorphous silicon, polycrystalline germanium, amorphous germanium, silicon carbide, gallium arsenide or silicon germanium. The first electrode layer 112 may also be comprised of metal or a metal compound, including one or more of copper, tungsten, aluminum, silver, titanium, tantalum, titanium nitride and tantalum nitride.

The second patterned layer is a patterned photoresist layer formed by a photolithography process. The second patterned layer may also be a mask formed by multiple patterning masking process, such as a self-aligned double patterning mask. A process for removing the second pattered layer includes a dry etching process or a wet etching process.

A process for etching the first electrode layer 112 is a dry etching process which is anisotropic. In the embodiment, the first electrode layer 112 is etched until the surface of the second dielectric layer 181 is exposed.

In the embodiment, before the first electrode layer 112 is formed, a stopper 192 is formed in the stopper groove 191 (as shown in FIG. 3). Forming the stopper 192 includes: forming a stopper film on the surface of the second dielectric layer 181 and in the stopper groove 191; and polishing the stopper film until the surface of the second dielectric layer 181 is exposed, to form the stopper 192.

In another embodiment, the stopper 192 and the first electrode layer 112 are formed simultaneously. Forming the stopper 192 and the first electrode layer 112 includes: forming a conductive film in the stopper groove 191 and on the surface of the second dielectric layer 181; flattening the conductive film; and then etching a part of the conductive film until the surface of the second dielectric layer 181 is exposed, to form the first electrode layer 112 on the surface of the second dielectric layer 181 and form the stopper 192 in the stopper groove 191. The stopper film is formed by a deposition process, including a physical vapor deposition process, a chemical vapor deposition process or an atomic layer deposition process. The stopper 192 is comprised of a semiconductor material, including polycrystalline silicon, amorphous silicon, polycrystalline germanium, amorphous germanium, silicon carbide, gallium arsenide or silicon germanium. The stopper 192 may also be comprised of metal or a metal compound, including one or more of copper, tungsten, aluminum, silver, titanium, tantalum, titanium nitride and tantalum nitride. The stopper 192 may also be comprised of an insulating material, including a silicon oxide, a silicon nitride, a silicon oxynitride, a low-k dielectric material or an ultra-low-k dielectric material.

Figure 5:
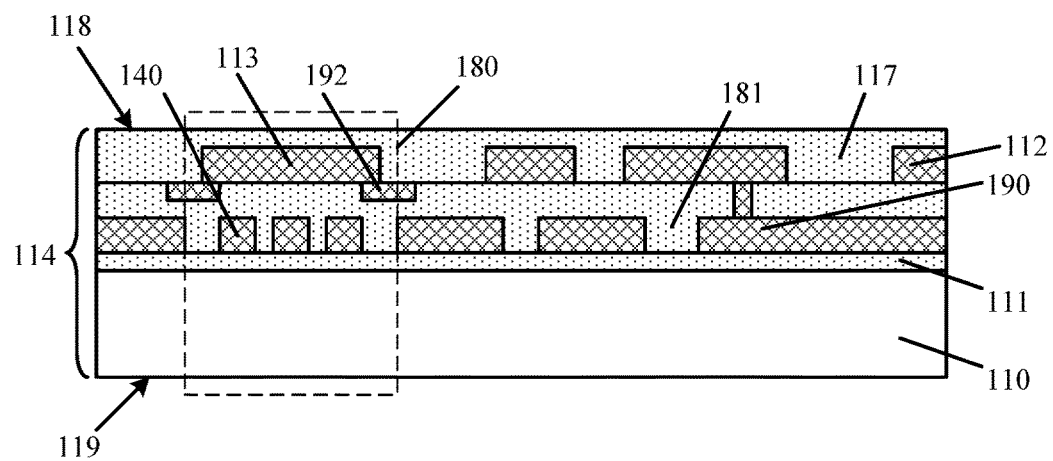

Referring to FIG. 5, a second coupling layer 117 is formed at the side of the third surface of the second substrate 114.

In the embodiment, the second substrate 114 further includes the second coupling layer 117. A surface of the second coupling layer 117 is the third surface 118.

In the embodiment, the second coupling layer 117 is located on surfaces of the first electrode layer 112 and the second dielectric layer 181. The second coupling layer 117 is used to protect the sensitive electrode 113. The second coupling layer 117 and the first coupling layer 106 (as shown in FIG. 1) are to be bonded to each other subsequently, so that the first substrate 100 (as shown in FIG. 1) and the second substrate 114 are bonded to each other. The second coupling layer 117 has a flat surface, that is, the third surface 118 of the second substrate 114 is flat. In another embodiment, only the first substrate 100 includes the first coupling layer, or only the second substrate 114 includes the second coupling layer 117.

The second coupling layer 117 is comprised of an insulating material, a metal material, a metal compound material, a semiconductor material or any combination thereof. The insulating material includes silicon oxide, silicon nitride, silicon oxynitride, a low-k dielectric material or an ultra-low-k dielectric material. The metal material includes one or more of copper, tungsten, aluminum, silver, titanium and tantalum. The metal compound material includes one or both of titanium nitride and tantalum nitride. The semiconductor material includes one or more of polycrystalline silicon, amorphous silicon, polycrystalline germanium, amorphous germanium, silicon germanium and silicon carbide doped with ions. The doping ion includes one or more of a p-type ion, an n-type ion, a carbon ion, a nitrogen ion, a fluoride ion and a hydrogen ion.

In an embodiment, the second coupling layer 117 is comprised of silicon oxide; and forming the second coupling layer 117 includes: depositing a second coupling film on surfaces of the second dielectric layer 181 and the first electrode layer 112; and flattening the second coupling film by a chemical mechanical polishing process, to form the second coupling layer 117.

In the embodiment, at least one of the first coupling layer 106 and the second coupling layer 117 is comprised of an insulating material, or surfaces of both are comprised of insulating material. In the embodiment, after the first substrate 100 and the second substrate 114 are bonded to each other, a first conductive plug is formed from the fifth surface of the second substrate 114, with the first conductive plug passing through to the surface of the conductive layer 103, and an electrical connection between the conductive layer 103 and the sensitive electrode 113 is formed by the first conductive plug and the first conductive layer. Thus, no conductive structure has to be formed between a contacting bonding surface between the first coupling layer 106 and the second coupling layer 117, and no conductive material is needed on surfaces of the first coupling layer 106 and the second coupling layer 117. Thus, a selection of a material of the first coupling layer 106 and the second coupling layer 117 has a large range, thereby meeting requirement of the more process technologies.

In another embodiment, the second substrate may not include the second coupling layer, and the first substrate may include the first coupling layer.

Figure 6:
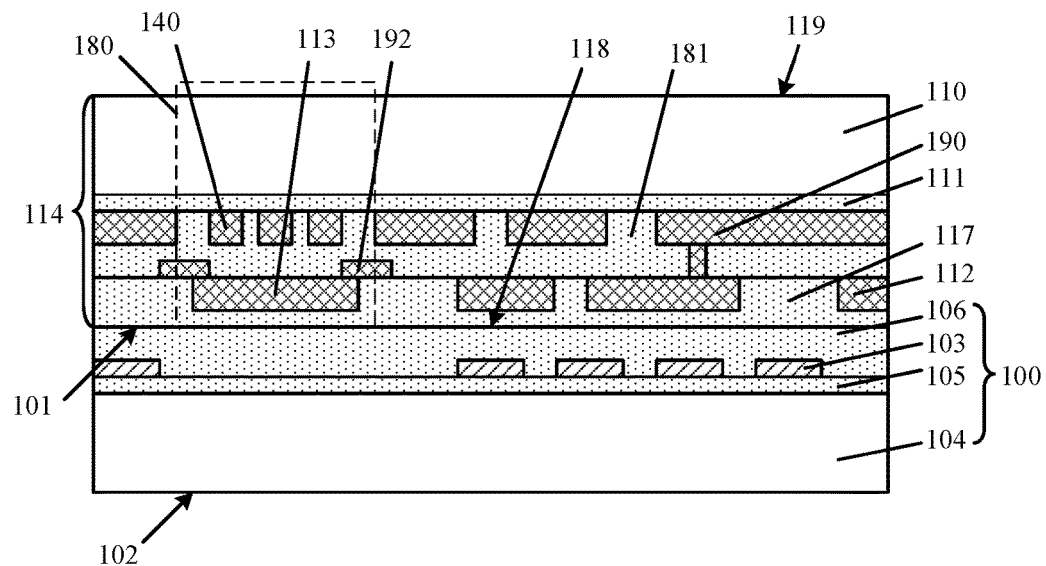

Referring to FIG. 6, the first surface 101 of the first substrate 100 and the third surface 118 of the second substrate 114 are bonded to each other.

In an embodiment, a process for bonding the first substrate 100 and the second substrate 114 to each other is a direct-bonding process, including fusion bonding, anodic bonding, eutectic bonding or thermal compression bonding and the like. In another embodiment, a process for bonding the first substrate 100 and the second substrate 114 to each other is an adhesive bonding process. In this case, an adhesive bonding layer is used to bond the first substrate 100 and the second substrate 114 to each other, and the adhesive binding layer is comprised of an insulating material, a semiconductor material, a metal material or an organic material. The first coupling layer or the second coupling layer is the adhesive binding layer.

In the embodiment, a surface of the first coupling layer 106 is flat, and a third surface of the second coupling layer 117 is flat. The surface of the first coupling layer 106 is the first surface of the first substrate 100, and the surface of the second coupling layer 117 is the third surface of the second substrate 114. The surface of the first coupling layer 106 and the surface of the second coupling layer 117 are in direct contact with each other and are bonded to each other, so that the first substrate 100 and the second substrate 114 are stacked together and are bonded to each other.

The first surface 101 of the first substrate 100 is in direct contact with the third surface 118 of the second substrate 114, and the first surface 101 and the third surface 118 are flat. Thus, a contact area between the first surface 101 and the third surface 118 is large, so that a support strength between the first substrate 100 and the second substrate 114 is great, a stacked structure formed by the first substrate 100 and the second substrate 114 is more resistant to bending, cracking or deforming, and the formed microphone has a more stable structure and improved durability.

Moreover, except the formed cavity 121, the first surface 101 of the first substrate 100 is mostly in direct contact with the third surface 118 of the second substrate 114, thus a distance from a fourth surface 119 of the second substrate 114 to the second surface 102 of the first substrate 100 is short, which is beneficial to decrease a thickness and a size of the formed MEMS microphone and improve the integration level of the device.

In addition, an electrical connection between the conductive layer 103 and the sensitive electrode 113 is formed by forming subsequently a first conductive plug from the side of the fifth surface of the second substrate 114, with the first conductive plug passing through to the surface of the conductive layer 103. Thus, no additional conductive layer is needed between the first surface 101 of the first substrate 100 and the third surface 118 of the second substrate 114, thereby preventing an additional stress from being generated between the first surface 101 and the third surface 118 by the additional conductive layer due to a difference in thermal expansion coefficient, and thus ensuring the accuracy of the electrical signal outputted from the sensitive electrode 113.

A material of the first surface 101 of the first substrate 100 and a material of the third surface 118 of the second substrate 114 are not limited by process, so that the first surface 101 and the third surface 118 may be comprised of materials with a smaller difference in thermal expansion coefficients, thereby preventing an undesired stress from being generated between the first surface 101 and the third surface 118 due to a large difference in the thermal expansion coefficients thereof, stabilizing the coupling and improving the reliability and accuracy of the formed MEMS microphone. Moreover, a process for forming the first substrate 100 and the second substrate 114 has a higher flexibility. Thus, a manufacturing process for the MEMS can be applied widely, which is beneficial and compatible with other process for integrating the conductive layer and reducing the manufacturing cost.

Figure 7:
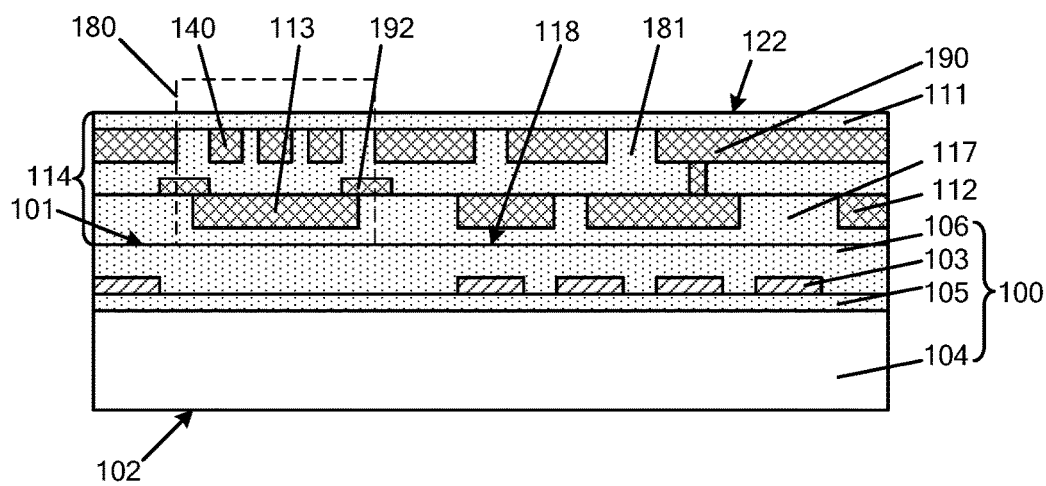

Referring to FIG. 7, after the first surface 101 of the first substrate 100 and the third surface 118 of the second substrate 114 are bonded to each other, the second base 110 is removed, to form a fifth surface 122 opposite to third surface 118 of the second substrate 114.

In the embodiment, since a protective layer 111 is provided between the second base 110 and the sensitive electrode 113, a surface of the protective layer 111 is exposed after the second base 110 is removed.

A process for removing the second base 110 includes a chemical mechanical polishing process or an etching process. The etching process may be a dry etching process, a wet etching process or a combination of thereof. Since a process for removing the second base 110 is performed along the fourth surface 119 of the second substrate 114, the fifth surface 122 is formed at the side of the second substrate 114 opposite to the third surface 118 after the second base is removed.

Figure 8:
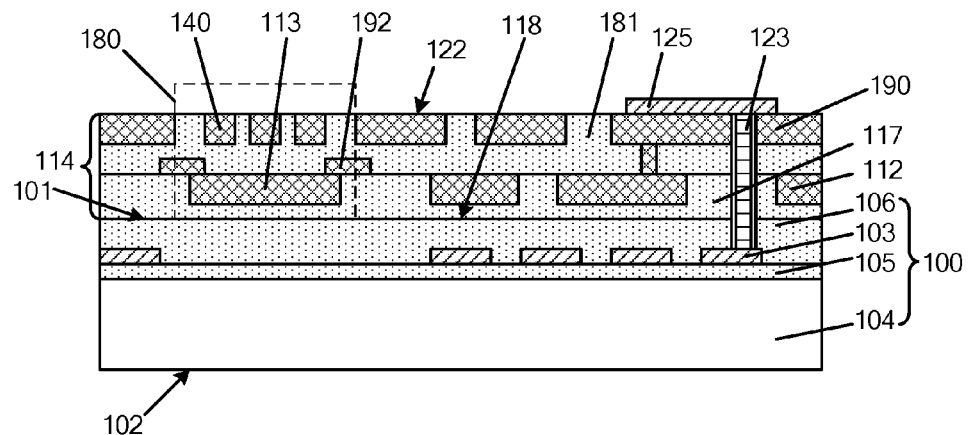

Referring to FIG. 8, a first conductive plug 123 is formed from the side of the fifth surface 122 of the second substrate 114, with the first conductive plug 123 passing through to at least one of the conductive layers 103. The first conductive plug 123 is used to form an electrical connection between the conductive layer 103 and the sensitive electrode 113.

In the embodiment, in order to electrically connect the formed first conductive plug 123 to the fixed electrode more easily, the protective layer 111 (as shown in FIG. 7) is removed before the first conductive plug 123 is formed.

The first surface 101 of the first substrate 100 is in direct contact with the third surface 118 of the second substrate 114, and no electrical connection is needed at a contact bonding interface between the first surface 101 and the third surface 118. Thus, the first conductive plug 123 is formed. One end of the first conductive plug 123 is electrically connected to the conductive layer 103 and the other end of the first conductive plug 123 is exposed through the fifth surface 122 of the second substrate 114. Thus, a first conductive layer 125 may be formed directly on the fifth surface 122 subsequently so as to electrically connect the first conductive layer 125 to the first conductive plug 123 and the second electrode layer 190, thereby achieving an electrical connection between the conductive layer 103 and the sensitive electrode 113.

Since no additional electrical connection layer is needed between the first surface 101 and the third surface 118, the first surface 101 is in contact with the third surface 118 mostly. Since a contact area between the first surface 101 and the third surface 118 is large, the bonded first substrate 100 and second substrate 114 has a higher mechanical strength, and thus a stacked structure formed by the first substrate 100 and the second substrate 114 is more resistant to bending or cracking. Moreover, since no additional electrical connection layer is needed between the first surface 101 and the third surface 118, the first surface 101 and the third surface 118 may be comprised of materials with a similar thermal expansion coefficient, thereby preventing a stress or delamination from being generated between the first substrate 100 and the second substrate 114 due to a difference in the thermal expansion coefficients when the first substrate 100 is in contact with the second substrate 114. Thus, the stacked structure formed by the first substrate 100 and the second substrate 114 has a stable coupling, decreased size and higher adaptability of various process technologies.

Forming the first conductive plug 123 includes: forming a patterned layer on the fifth surface 122 of the second substrate 114, where a corresponding region of the fifth surface 122 to form the first conductive plug 123 is exposed through the pattern layer; etching the second electrode layer 190, the second dielectric layer 181, the second coupling layer 116 and the first coupling layer 106 by using the patterned layer as a mask, until a surface of the conductive layer 103 is exposed, to form a first through hole in the second electrode layer 190, the second dielectric layer 181, the second coupling layer 116 and the first coupling layer 106; forming a conductive film on the fifth surface 122 and in the first through hole for full-filling the first through hole; and removing an undesired conductive film on the fifth surface 122 until the fifth surface 122 is exposed. In an embodiment, the conductive film on the fifth surface may be removed completely. In another embodiment, a part of the conductive layer on the fifth surface 122 may be kept.

An end of the first conductive plug 123 may be protruded, depressed or flush relative to the fifth surface 122 of the second substrate 114.

In an embodiment, an insulating layer is formed on a surface of a side wall of the first through hole before the conductive film is formed, and a conductive film is formed after the insulating layer is formed for full-filling the first through hole. The insulating layer is used to electrically isolate the conductive film from the second electrode layer 190 and the first electrode layer 112.

The first conductive plug 123 is comprised of copper, tungsten, aluminum, silver or gold. A process for forming the conductive film includes a physical vapor deposition process, a chemical vapor deposition process, an atomic layer deposition process, an electroplating process or a chemical plating process. A process for flattening the conductive film includes a chemical mechanical polishing process. In addition, a first barrier layer may be formed on the surface of the side wall of the first through hole, the conductive film is formed on a surface of the first barrier layer, and the first barrier layer is comprised of one or more of titanium, tantalum, tantalum nitride or titanium nitride.

Figure 9:
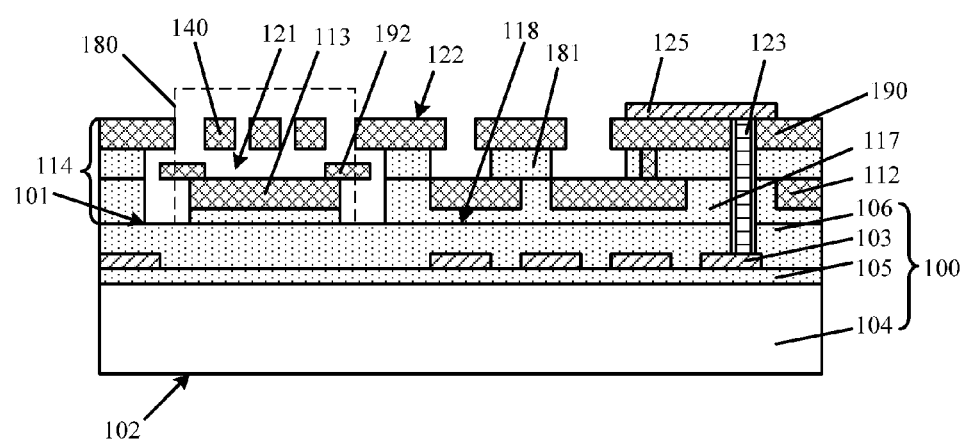

Referring to FIG. 9, a cavity 121 is formed between the first substrate 100 and the sensitive region 180 of the second substrate 114.

The cavity 121 may be used as medium between the sensitive electrode 113 and the fixed electrode 140. When being deformed due to a sound vibration, the sensitive electrode 113 cause a change in the capacitance of a capacitor structure formed by the cavity 121, the sensitive electrode 113 and the fixed electrode 140, so as to output an electrical signal changing with sound.

In the embodiment, the second electrode layer 190, the fixed electrode 140 and the second dielectric layer 181 are exposed through the fifth surface 122 of the second substrate 141. The fixed electrode 140 is provided with several grooves or through holes, which are filled with the second dielectric layer 181. Thus, by etching the second dielectric layer 181 from the surface of the second dielectric layer 181, the second dielectric layer 181 located between the sensitive electrode 113 and the fixed electrode 140 may be removed and the cavity 121 may be formed.

A process for forming the cavity 121 includes an etching process, which is isotropic and may be a wet etching process or a dry etching process. The etching process which is isotropic has a similar etching rate in each direction. Thus, the etching may be performed in a direction parallel to the surface of the second substrate 114, to remove the second dielectric layer 181 between the fixed electrode 140 and the sensitive electrode 113.

In the embodiment, the cavity 121 is formed after the first substrate 100 and the second substrate 114 are bonded. In another embodiment, the cavity is formed between the sensitive electrode 113 and the fixed electrode 140 in the second substrate 114 before the first substrate 100 and the second substrate 114 are bonded, since both the fixed electrode 140 and the sensitive electrode 113 are located in the second substrate 114.

Figure 10:
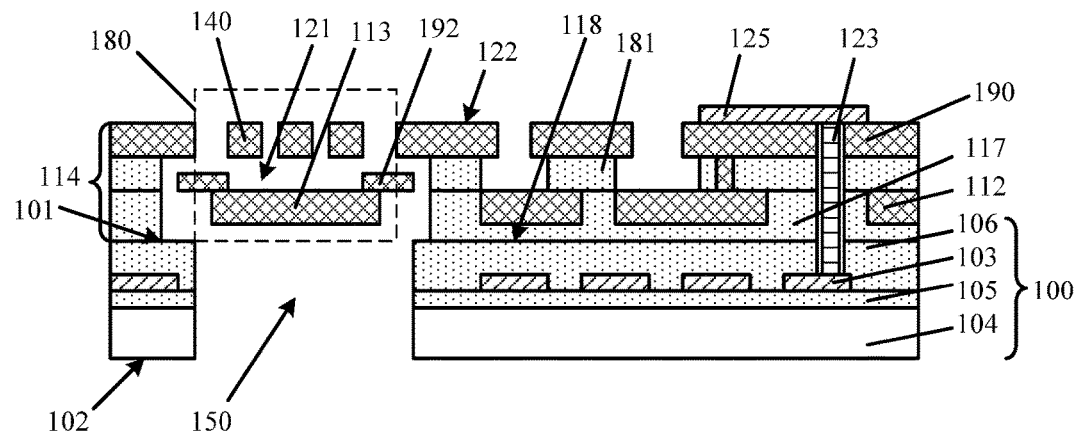

Referring to FIG. 10, a second opening 150 is formed in the first substrate 100, and a position of the second opening 150 corresponds to a position of the sensitive region 180 of the second substrate 114.

The second opening 150 serves as a back cavity of the MEMS, and is used to improve the vibration sensitivity of the sensitive electrode 113, so that the sensitivity of the vibration of the sensitive electrode 113 due to the sound wave is improved, and an electrical signal changing with the sound is outputted.

In the embodiment, the second opening 150 is formed after the first substrate 100 and the second substrate 114 are bonded. The second opening 150 passes through the first substrate 100, and the second opening 150 is in communication with the cavity 121.

Forming the second opening 150 includes: forming a patterned layer on the second surface 102 of the first substrate 100, where a region of the second surface 102 corresponding to the sensitive region 180 is exposed through the patterned layer; and etching the first substrate 100 by using the patterned layer as a mask until the sensitive electrode 113 is exposed, to form the second opening 150.

In the embodiment, before the first substrate 100 is etched to form the second opening 150, the method further includes thinning the second surface 102 of the first substrate 100 to thin the first substrate 100, so that an etching depth is reduced, and a process for etching the first substrate 100 is accurate and easy to control.

In another embodiment, the second opening may be formed in the first substrate 100 before the first substrate 100 and the second substrate 114 are bonded. The second opening passes through the first substrate 100. Alternatively, the second opening is located at the side of the first surface 101 of the first substrate 100, and the second opening does not pass through the first substrate 100.

Accordingly, an MEMS microphone formed by using the above-described method is further provided according to the embodiment of the present disclosure. Referring still to FIG. 10, the MEMS microphone includes a first substrate 100. The first substrate 100 includes a first surface 101 and a second surface 102 opposite to the first surface 101. The first substrate 100 includes at least one conductive layer 103 located at the side of the first surface 101 of the first substrate 100. The MEMS microphone further includes a second substrate 114. The second substrate 114 includes a third surface 118 and a fifth surface 122 opposite to the third surface 118. The second substrate 114 includes a sensitive electrode 113. The second substrate 114 includes a sensitive region 180 in which the sensitive electrode 113 is located. The first surface 101 of the first substrate 100 and the third surface 118 of the second substrate 114 are bonded to each other. A cavity 121 is provided between the first substrate 100 and the sensitive region 180 of the second substrate 114. The MEMS microphone further includes a first conductive plug 123 formed from the side of the fifth surface 122 of the second substrate 114 and passing through to at least one of the conductive layers 103. The first conductive plug 123 is used to form an electrical connection between the conductive layer 103 and the sensitive electrode 113.

The above-described structure will be explained in detail below.

In the embodiment, the MEMS microphone further includes a fixed electrode 140. The fixed electrode 140 is located at the side of the third surface 118 of the second substrate 114. A position of the fixed electrode 140 corresponds to a position of the sensitive electrode 113. The MEMS microphone further includes a cavity 121 located between the fixed electrode 140 and the sensitive electrode 113. In another embodiment, the fixed electrode may be located in the first substrate, the second substrate does not include the fixed electrode, and a position of the fixed electrode corresponds to a position of the sensitive region 180.

In the embodiment, the second substrate 114 further includes a first electrode layer 112 located on or above the second base 110. The first electrode layer 112 includes the sensitive electrode 113. The first substrate 100 or the second substrate 114 further includes a second electrode layer 190 including the fixed electrode 140. The MEMS microphone further includes a stopper 192 located between the first electrode layer 112 and the second electrode layer 190, and a position of the stopper 192 corresponds to a position of the sensitive region 180.

In the embodiment, the MEMS microphone further includes a second opening 150 formed in the first substrate 100, and a position of the second opening 150 corresponds to a position of the sensitive region of the second substrate 114. In an embodiment, the second opening 150 passes through the first substrate 100. In another embodiment, the second opening 150 is located at the side of the first surface 101 of the first substrate 100.

In an embodiment, the first substrate 100 further includes a circuit including a semiconductor device structure and an electrical interconnection structure. The conductive layer 103 may be a conductive layer of the circuit, or may be the conductive layer added to the circuit. The conductive layer 103 may be a conductor or a semiconductor.

The second substrate 114 further includes the second dielectric layer 181 located between the first electrical interconnection layer 112 and the second electrical interconnection layer 190. The second dielectric layer 181 is comprised of an insulating material, including a silicon oxide, a silicon nitride, a silicon oxynitride, a low-k dielectric material or an ultra-low-k dielectric material.

The sensitive electrode 113 is comprised of a semiconductor material, including single crystal silicon, single crystal germanium, an III-V group compound, an II-VI group compound, polycrystalline silicon, amorphous silicon, polycrystalline germanium, amorphous germanium, silicon carbide or silicon germanium.

A first conductive layer 125 is provided on the fifth surface 122 of the second substrate 114. The first conductive layer 125 is further located on surfaces of the first conductive plug 123 and the second electrical interconnection layer 190. The second electrical interconnection layer 190 is electrically connected to the first electrical interconnection layer 112 via the conductive plug, and the first electrical interconnection layer 112 is electrically connected to the sensitive electrode 113. Thus, the first conductive layer 125 is electrically connected to the sensitive electrode 113; and the conductive layer 103 is electrically connected to the sensitive electrode 113 via the first conductive plug 123 and the first conductive layer 125.

The second substrate 114 further includes a second coupling layer 117 located at the side of the third surface 118, or the first substrate 100 includes a first coupling layer 106 located at the side of the first surface 101. Alternatively, the second substrate 114 further includes a second coupling layer 117 located at the side of the third surface 118, and the first substrate 100 includes the first coupling layer 106 located at the side of the first surface 101. The first coupling layer 106 or the second coupling layer 117 is comprised of an insulating material, a metal material, a metal compound material, a semiconductor material or any combination thereof. In an embodiment, at least one of the first coupling layer 106 and the second coupling layer 117 is comprised of an insulating material.

In an embodiment, the first coupling layer 106 or the second coupling layer 117 is an adhesive bonding layer, and is comprised of an insulating material, a semiconductor material, a metal material or an organic material. In another embodiment, the first coupling layer 106 or the second coupling layer 117 is a bonding layer; or the first coupling layer 106 and the second coupling layer 117 each are bonding layers.

Second Embodiment

Figure 11:
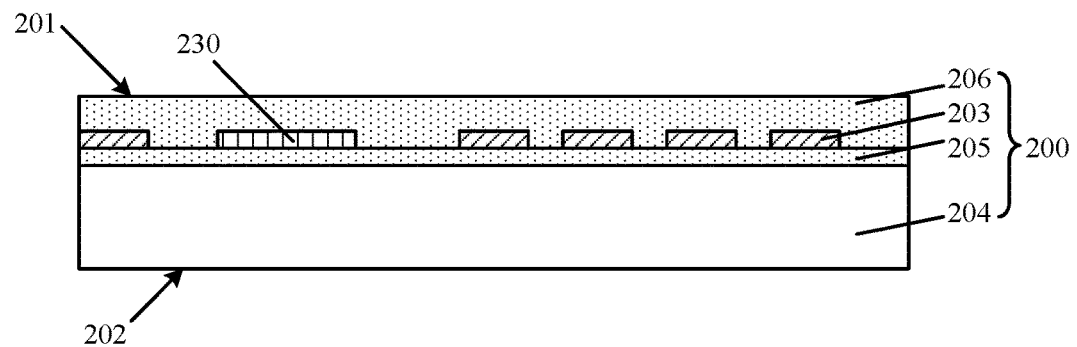
FIG. 11 to FIG. 12 are schematic sectional views of a structure of a MEMS microphone during a forming process according to an embodiment of the present disclosure.
Figure 12:
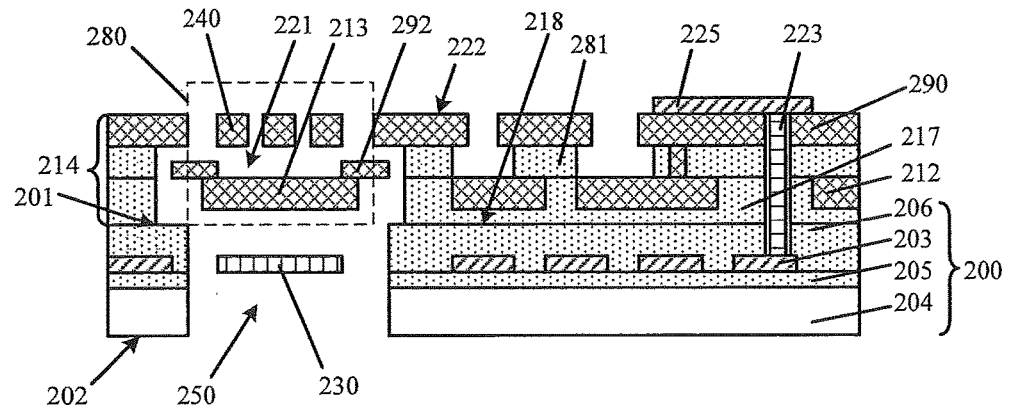

FIG. 11 to FIG. 12 are schematic sectional views of a structure of an MEMS microphone during a forming process according to an embodiment of the present disclosure.

Referring to FIG. 11, a first substrate 200 is provided. The first substrate 200 includes a first surface 201 and a second surface 202 opposite to the first surface 201. The first substrate 200 includes at least one conductive layer 203. The conductive layer 203 is located at the side of the first surface 201 of the first substrate 200. The first substrate 200 further includes a self-test electrode 230.

In an embodiment, the first substrate 200 further includes a circuit including a semiconductor device structure and an electrical interconnection structure. The conductive layer 203 may be a conductive layer of the circuit, or may be a conductive layer added to the circuit. The conductive layer may be a conductor or a semiconductor.

In the embodiment, the conductive layer 203 is formed on or above the first base 204; and a first dielectric layer 205 is provided between the conductive layer 203 and the first base 204. The first substrate 200 may include a first coupling layer 206 located at the side of the first surface 201. The first base 204, the first dielectric layer 205, the conductive layer 203 and the first coupling layer 206 are respectively the same as those described in the preceding embodiments, which are not described here.

A position of the self-test electrode 230 corresponds to a position of a sensitive region of the second substrate. In the embodiment, the self-test electrode 230 is formed on a surface of the first dielectric layer 205. The self-test electrode 230 is disposed correspondingly to the sensitive electrode after the first substrate 200 and the second substrate are bonded to each other, and the position of the self-test electrode 230 corresponds to the position of the sensitive region of the second substrate.

In the embodiment, the self-test electrode 230 is located in the same layer as the conductive layer 203; and the self-test electrode 230 may or may not be electrically connected to the conductive layer 203. In another embodiment, the self-test electrode 230 may be disposed on or above or under or below the conductive layer 203. In an embodiment, the self-test electrode 230 is located in the same layer as the fixed electrode or the self-test electrode 230 may be disposed on or above or below the fixed electrode, in a case that the fixed electrode is formed in the first substrate 200.

After the first substrate 200 and the second substrate are bonded to each other, the self-test electrode 230, when being supplied with a bias voltage, may apply an electrostatic attraction to the sensitive region of the second substrate. The sensitive region of the second substrate is a sensitive film, and the electrostatic attraction may cause the sensitive electrode in the sensitive film to have a deformation. Whether the sensitive electrode operates normally is detected by detecting whether the electrostatic attraction causes a change in the capacitance between the sensitive electrode and the fixed electrode.

The self-test electrode 230 is comprised of metal, a metal compound or a semiconductor material doped with irons. Forming the self-test electrode 230 includes: depositing an electrode material layer on a surface of the first dielectric layer 205; forming a patterned layer on a surface of the electrode material layer, where a part of the surface of the electrode material layer is exposed through the patterned layer; and etching the electrode material layer by using the patterned layer as a mask until the surface of the first dielectric layer 205 is exposed. A process for forming the electrode material layer includes a chemical vapor deposition process, a physical vapor deposition process or an atomic layer deposition process. The patterned layer includes the patterned photoresist layer. A process for etching the electrode material includes a dry etching process which is anisotropic.

In the embodiment, the self-test electrode 230 and the conductive layer 203 are formed simultaneously. In another embodiment, the self-test electrode may be formed before or after the conductive layer is formed.

Referring to FIG. 12, a second substrate 214 is provided. The second substrate 214 includes a third surface 218 and a fourth surface opposite to the third surface 218. The second substrate 214 includes a second base and a sensitive electrode 213 located on or above the second base. The second substrate 214 includes a sensitive region 280 in which the sensitive electrode 213 is located. The sensitive electrode 213 is located at the side of the third surface 218 of the second substrate 214. The first surface 201 of the first substrate 200 and the third surface 218 of the second substrate 214 are bonded to each other. A cavity 221 is formed between the first substrate 200 and the sensitive region 280 of the second substrate 214. The second base is removed, to form a fifth surface 222 opposite to the third surface 218 of the second substrate 214. A first conductive plug 223 is formed from the side of the fifth surface 222 of the second substrate 214, with the first conductive plug 223 passing through to at least one of the conductive layers 203. The first conductive plug 223 is used to form an electrical connection between the conductive layer 203 and the sensitive electrode 213.

In the embodiment, the second substrate 214 further includes a fixed electrode 240. The fixed electrode 240 is located at the side of the third surface 218 of the second substrate 214, and a position of the fixed electrode 240 corresponds to a position of the sensitive electrode 213. A cavity is formed between the sensitive electrode 213 and the fixed electrode 240.

In the embodiment, the method further includes forming a second opening 250 in the first substrate 200. The second opening 250 is in communication with the cavity 221. The second opening 250 passes through the first substrate 200. Alternatively, the second opening 250 is located at the side of the first surface 201 of the first substrate 200, and does not pass through the first substrate 200.

In the embodiment, a first conductive layer 225 is formed on the fifth surface of the second substrate 214. The first conductive layer 225 is electrically connected to the sensitive electrode 213 via a second electrode layer 290 and a first electrode layer 212. The first conductive layer 225 is also located on a top surface of the first conductive plug 223, so that the first conductive plug 223 forms an electrical connection between the conductive layer 203 and the sensitive electrode 213.

In the embodiment, a second dielectric layer 281 is provided between the first electrode layer 212 and the second electrode layer 290. The first electrode layer 212 is electrically connected to the sensitive electrode 213; and the second electrode layer 290 is electrically connected to the fixed electrode 240.

In the embodiment, a second coupling layer 217 is provided at the side of the third surface 218 of the second substrate 214. A surface of the second coupling layer 217 is the third surface 218.

After the first surface 201 of the first substrate 200 and the third surface 218 of the second substrate 214 are bonded to each other, a position of the self-test electrode 230 corresponds to a position of the sensitive region 280, so that the self-test electrode 230 applies an electrostatic attraction to the sensitive electrode 213 to detect whether the sensitive electrode operates normally.

A step of providing the second substrate 214, a step of bonding the first substrate 200 and the second substrate 214 to each other, a step of removing the second base, a step of forming the first conductive plug 223 and a step of forming the first conductive layer 225 are respectively the same as those described in the preceding embodiments, which are not described here.

Accordingly, an MEMS microphone formed by using the above-described method is further provided according to the embodiment of the present disclosure. Referring still to FIG. 12, the MEMS microphone includes a first substrate 200. The first substrate 200 includes a first surface 201 and a second surface 202 opposite to the first surface 201. The first substrate 200 includes at least one conductive layer 203 located at the side of the first surface 201 of the first substrate 200. The first substrate 200 further includes a self-test electrode 230. The MEMS microphone further includes a second substrate 214. The second substrate 214 includes a third surface 218 and a fifth surface 222 opposite to the third surface 218. The second substrate 214 includes a sensitive electrode 213. The second substrate 214 includes a sensitive region 280 in which the sensitive electrode 213 is located. The first surface 201 of the first substrate 200 and the third surface 218 of the second substrate 214 are bonded to each other. A cavity 221 is provided between the first substrate 200 and the sensitive region 280 of the second substrate 214. A position of the self-test electrode 230 corresponds to a position of the sensitive region 280. The MEMS microphone further includes a first conductive plug 223 formed from the side of the fifth surface 222 of the second substrate 214 and passing through to at least one of the conductive layers 203. The first conductive plug 223 is used to form an electrical connection between the conductive layer 203 and the sensitive electrode 213.

The position of the self-test electrode 230 corresponds to the position of the sensitive region 280 of the second substrate 214. The self-test electrode 230 is disposed correspondingly to the sensitive electrode 213.

In the embodiment, the self-test electrode 230 is located in the same layer as the conductive layer 203; and the self-test electrode 230 may or may not be electrically connected to the conductive layer 203. In another embodiment, the self-test electrode 230 may be disposed on or above or below the conductive layer 203.

The self-test electrode 230 is comprised of metal, a metal compound or a semiconductor material doped with irons. In the embodiment, the self-test 230 and the conductive layer 203 are formed simultaneously. In another embodiment, the self-test electrode may be formed before or after the conductive layer 203 is formed.

The self-test electrode 230 is comprised of metal, a metal compound or a semiconductor material doped with irons. The metal material includes one or more of copper, tungsten, aluminum, silver, titanium and tantalum. The metal compound material includes one or both of titanium nitride and tantalum nitride. The semiconductor material includes one or more of polycrystalline silicon, amorphous silicon, polycrystalline germanium, amorphous germanium, silicon germanium and silicon carbide doped with ions. The doping ion includes a p-type ion, an n-type ion, a carbon ion, a nitrogen ion, a fluoride ion and a hydrogen ion.

When being supplied with a bias voltage, the self-test electrode 230 may apply an electrostatic attraction to the sensitive electrode 213. The electrostatic attraction may cause the sensitive film to have a deformation. Whether the sensitive electrode 213 operates normally is detected by detecting whether the electrostatic attraction causes a change in the capacitance between the sensitive electrode 213 and the fixed electrode 240.

In an embodiment, the first substrate 200 further includes a circuit including a semiconductor device structure and an electrical interconnection structure. The conductive layer 203 may be a conductive layer of the circuit, or may be a conductive layer added to the circuit. The conductive layer may be a conductor or a semiconductor.

In the embodiment, the conductive layer 203 is formed on or above the first base 204; and a first dielectric layer 205 is provided between the conductive layer 203 and the first base 204. The first substrate 200 may include a first coupling layer 206 located at the side of the first surface 201. The first base 204, the first dielectric layer 205, the conductive layer 203 and the first coupling layer 206 are respectively the same as those described in the preceding embodiments, which are not described here.

In the embodiment, the second substrate 214 further includes a fixed electrode 240. The fixed electrode 240 is located at the side of the third surface 218 of the second substrate 214, and a position of the fixed electrode 240 corresponds to a position of the sensitive electrode 213. A cavity is formed between the sensitive electrode 213 and the fixed electrode 240.

In the embodiment, a second opening 250 is formed in the first substrate 200. The second opening 250 is in communication with the cavity 221. The second opening 250 passes through the first substrate 200. Alternatively, the second opening 250 is located at the side of the first surface 201 of the first substrate 200, and does not pass through the first substrate 200.

In the embodiment, a first conductive layer 225 is provided on the fifth surface of the second substrate 214. The first conductive layer 225 is electrically connected to the sensitive electrode 213 via a second electrode layer 290 and a first electrode layer 212. The first conductive layer 225 is also located on a top surface of the first conductive plug 223, so that the first conductive plug 223 forms an electrical connection between the conductive layer 203 and the sensitive electrode 213.

In the embodiment, a second dielectric layer 281 is provided between the first electrode layer 212 and the second electrode layer 290. The first electrode layer 212 is electrically connected to the sensitive electrode 213; and the second electrode layer 290 is electrically connected to the fixed electrode 240.

In the embodiment, a second coupling layer 217 is provided at the side of the third surface 218 of the second substrate 214. A surface of the second coupling layer 217 is the third surface 218.

The first substrate 200, the second substrate 214, the sensitive electrode 213, the fixed electrode 240, the first conductive plug 223, the first conductive layer 225 and the second opening 250 are respectively the same as those described in the preceding embodiments, which are not described here.

Third Embodiment

Figure 13:
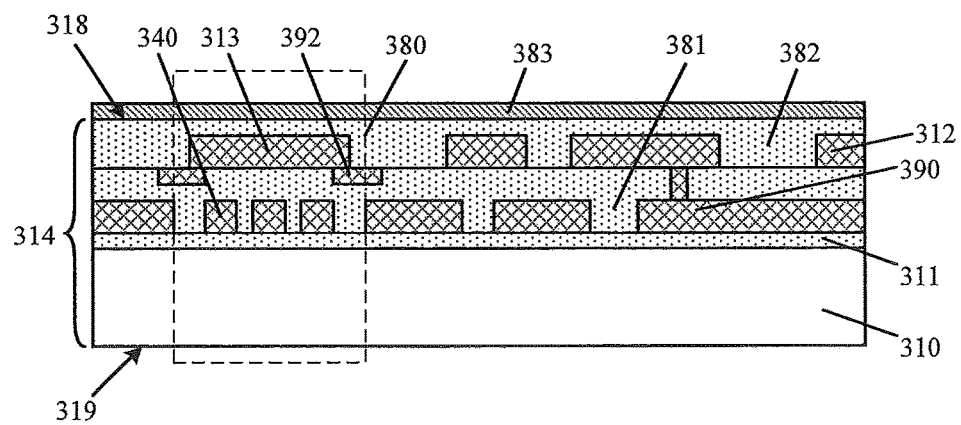
FIG. 13 to FIG. 14 are schematic sectional views of a structure of a MEMS microphone during a forming process according to an embodiment of the present disclosure.
Figure 14:
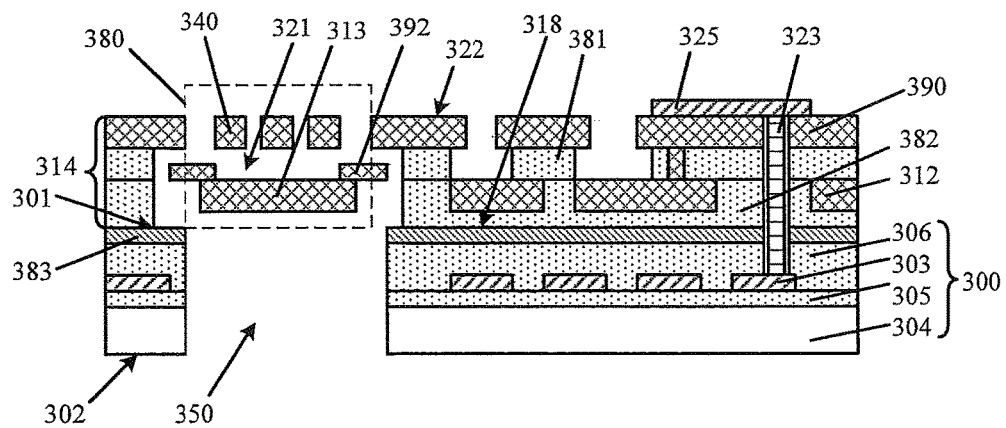

FIG. 13 to FIG. 14 are schematic sectional views of a structure of an MEMS microphone during a forming process according to an embodiment of the present disclosure.

Referring to FIG. 13, a second substrate 314 is provided. The second substrate 314 includes a third surface 318 and a fourth surface 319 opposite to the third surface 318. The second substrate 314 includes a second base 310 and a sensitive electrode 313 located on or above the second base 310. The second substrate 314 includes a sensitive region 380 in which the sensitive electrode 313 is located. The sensitive electrode 313 is located at the side of the third surface 318 of the second substrate 314.

In the embodiment, the method for forming the MEMS microphone further includes forming a material layer 383 at the side of the third surface 318 of the second substrate 314. The second substrate 314 further includes a first electrode layer 312 located on or above the second base 310. The first electrode layer 312 includes the sensitive electrode 313. The material layer 383 is used as an electrical shielding layer. The material layer 383 may also be used as an etching stopping layer for defining a stopping position of an etching process when a cavity or a second opening is formed subsequently.

In the embodiment, a surface of the material layer 383 is the third surface 318 of the second substrate 314; and the material layer 383 is used as a coupling layer to be subsequently bonded to the first substrate. In another embodiment, the material layer 383 may not be used as a coupling layer to be bonded to the first substrate, and a second coupling layer is formed on or above the material layer 383 and is bonded to the first surface of the first substrate.

The material layer 383 is formed by a deposition process, including a physical vapor deposition process, a chemical vapor deposition process or an atomic layer deposition process. The material layer 383 is comprised of a semiconductor material, including polycrystalline silicon, amorphous silicon, polycrystalline germanium, amorphous germanium, silicon carbide, gallium arsenide or silicon germanium. The material layer 383 may also be comprised of metal or a metal compound, including one or more of copper, tungsten, aluminum, silver, titanium, tantalum, titanium nitride and tantalum nitride.

In the embodiment, before the material layer 383 is formed, a third dielectric layer 382 is formed on surfaces of the sensitive electrode 313, the first electrode layer 312 and the second dielectric layer 382. The material layer 383 is formed on a surface of the third dielectric layer 382. The third dielectric layer 382 is formed by a deposition process, including a physical vapor deposition process, a chemical vapor deposition process or an atomic layer deposition process. The third dielectric layer 382 may be flattened by a chemical mechanical polishing process after the deposition process. The third dielectric layer 382 is comprised of an insulating material, including silicon oxide, silicon nitride, silicon oxynitride, a low-k dielectric material or an ultra-low-k dielectric material.

In the embodiment, the second substrate 314 further includes a fixed electrode 340. The fixed electrode 340 is located at the side of the third surface 318 of the second substrate 314, and a position of the fixed electrode 340 corresponds to a position of the sensitive electrode 313.

Referring to FIG. 14, a first substrate 300 is provided. The first substrate 300 includes a first surface 301 and a second surface 302 opposite to the first surface 301. The first substrate 300 includes at least one conductive layer 303 located at the side of the first surface 301 of the first substrate 300. The first surface 301 of the first substrate 300 and the third surface 318 of the second substrate 314 are bonded to each other. A cavity 321 is formed between the first substrate 300 and the sensitive region 380 of the second substrate 314. The second base is removed, to form a fifth surface 322 opposite to the third surface 318 of the second substrate 314. A first conductive plug 323 is formed from the side of the fifth surface 322 of the second substrate 314, with the first conductive plug 323 passing through to at least one of the conductive layers 303. The first conductive plug 323 is used to form an electrical connection between the conductive layer 303 and the sensitive electrode 313.

In the embodiment, after the first surface 301 of the first substrate 300 and the third surface 318 of the second substrate 314 are bonded to each other, the material layer 383 is located between the first electrode layer 312 and the first substrate 100.

In the embodiment, a first coupling layer 306 is provided at the side of the first surface 301 of the first substrate 300, and the material layer 383 and the first coupling layer 306 are in contact with and bonded to each other.

In an embodiment, the first substrate 300 further includes a circuit including a semiconductor device structure and an electrical interconnection structure. The conductive layer 303 may be a conductive layer of the circuit, or may be a conductive layer added to the circuit. The conductive layer 303 may be a conductor or a semiconductor.

In the embodiment, the conductive layer 303 is formed on or above the first base 304; and a first dielectric layer 305 is provided between the conductive layer 303 and the first base 304. The first substrate 300 may include a first coupling layer 306 located at the side of the first surface 301. The first base 304, the first dielectric layer 305, the conductive layer 303 and the first coupling layer 306 are respectively the same as those described in the preceding embodiments, which are not described here.

In the embodiment, the method for forming the MEMS microphone further includes: forming a cavity 321 between the sensitive electrode 313 and the fixed electrode 340; and forming a second opening 350 in the first substrate 300. The second opening 350 is in communication with the cavity 321. The second opening 350 passes through the first substrate 300. Alternatively, the second opening 350 is located at the side of the first surface 301 of the first substrate 300, and does not pass through the first substrate 300.

In the embodiment, the method for forming the MEMS microphone further includes forming a first conductive layer 325 on the fifth surface of the second substrate 314. The first conductive layer 325 is electrically connected to the sensitive electrode 313 via a second electrode layer 390 and a first electrode layer 312. The first conductive layer 325 is also located on a top surface of the first conductive plug 323, so that the first conductive plug 323 forms an electrical connection between the conductive layer 303 and the sensitive electrode 313.

In the embodiment, a second dielectric layer 382 is provided between the first electrode layer 312 and the second electrode layer 390. The first electrode layer 312 is electrically connected to the sensitive electrode 313; and the second electrode layer 390 is electrically connected to the fixed electrode 340.

A step of providing the second substrate 314, a step of bonding the first substrate 300 and the second substrate 314 to each other, a step of removing the second base, a step of forming the first conductive plug 323, a step of forming the first conductive layer 325, a step of forming the cavity 321 and a step of forming the second opening 350 are respectively the same as those described in the preceding embodiments, which are not described here.

Accordingly, an MEMS microphone formed by using the above-described method is further provided according to the embodiment of the present disclosure. Referring still to FIG. 14, the MEMS microphone includes a first substrate 300. The first substrate 300 includes a first surface 301 and a second surface 302 opposite to the first surface 301. The first substrate 300 includes at least one conductive layer 303 located at the side of the first surface 301 of the first substrate 300. The MEMS microphone further includes a second substrate 314. The second substrate 314 includes a third surface 318 and a fifth surface 322 opposite to the third surface 318. The second substrate 314 includes a sensitive electrode 313. The second substrate 314 includes a sensitive region 380 in which the sensitive electrode 313 is located. The first surface 301 of the first substrate 300 and the third surface 318 of the second substrate 314 are bonded to each other. A cavity 321 is provided between the first substrate 300 and the sensitive region 380 of the second substrate 314. The MEMS microphone further includes a first conductive plug 323 formed from the side of the fifth surface 322 of the second substrate 314 and passing through to at least one of the conductive layers 303. The first conductive plug 323 is used to form an electrical connection between the conductive layer 303 and the sensitive electrode 313.

In the embodiment, the MEMS microphone further includes a material layer 383 formed at the side of the third surface 318 of the second substrate 314. The second substrate 314 further includes a first electrode layer 312 located on or above the second base 310. The first electrode layer 312 is electrically connected to the sensitive electrode. The first electrode layer 312 includes the sensitive electrode 313. The material layer 383 is located between the first electrode layer 312 and the first substrate 300. The material layer 383 is used as an electrical shielding layer. The material layer 383 may also be used as an etching stopping layer for forming the cavity 321 or the second opening 350.

In the embodiment, a first coupling layer 306 is provided at the side of the first surface 301 of the first substrate 300, and the material layer 383 and the first coupling layer 306 are in contact with each other.

The material layer 383 is comprised of a semiconductor material, including polycrystalline silicon, amorphous silicon, polycrystalline germanium, amorphous germanium, silicon carbide, gallium arsenide or silicon germanium. The material layer 383 may also be comprised of metal or a metal compound, including one or more of copper, tungsten, aluminum, silver, titanium, tantalum, titanium nitride and tantalum nitride.

In the embodiment, a third dielectric layer 382 is provided between the sensitive electrode 313 and the material layer 383, and between the first electrode layer 312 and the material layer 383. The third dielectric layer 382 is comprised of an insulating material, including silicon oxide, silicon nitride, silicon oxynitride, a low-k dielectric material or an ultra-low-k dielectric material.

In the embodiment, the second substrate 314 further includes a fixed electrode 340. The fixed electrode 340 is located at the side of the third surface 318 of the second substrate 314, and a position of the fixed electrode 340 corresponds to a position of the sensitive electrode 313.

In an embodiment, the first substrate 300 further includes a circuit including a semiconductor device structure and an electrical interconnection structure. The conductive layer 303 may be a conductive layer of the circuit, or may be a conductive layer added to the circuit. The conductive layer 303 may be a conductor or a semiconductor.

In the embodiment, the conductive layer 303 is formed on or above the first base 304; and a first dielectric layer 305 is provided between the conductive layer 303 and the first base 304. The first substrate 300 may include a first coupling layer 306 located at the side of the first surface 301. The first base 304, the first dielectric layer 305, the conductive layer 303 and the first coupling layer 306 are respectively the same as those described in the preceding embodiments, which are not described here.

In the embodiment, the MEMS microphone further includes: a cavity 321 located between the sensitive electrode 313 and the fixed electrode 340; and a second opening 350 located in the first substrate 300. The second opening 350 is in communication with the cavity 321. The second opening 350 passes through the first substrate 300. Alternatively, the second opening 350 is located at the side of the first surface 301 of the first substrate 300, and does not pass through the first substrate 300.

In the embodiment, the MEMS microphone further includes a first conductive layer 325 located on the fifth surface 322 of the second substrate 314. The first conductive layer 325 is electrically connected to the sensitive electrode 313 via a second electrode layer 390 and a first electrode layer 312. The first conductive layer 325 is also located on a top surface of the first conductive plug 323, so that the first conductive plug 323 forms an electrical connection between the conductive layer 303 and the sensitive electrode 313.

In the embodiment, a second dielectric layer 382 is provided between the first electrode layer 312 and the second electrode layer 390. The first electrode layer 312 is electrically connected to the sensitive electrode 313; and the second electrode layer 390 is electrically connected to the fixed electrode 340.

The second substrate 314, the first conductive plug 323, the first conductive layer 325, the cavity 321 and the second opening 350 are respectively the same as those described in the preceding embodiments, which are not described here.

Fourth Embodiment

Figure 15:
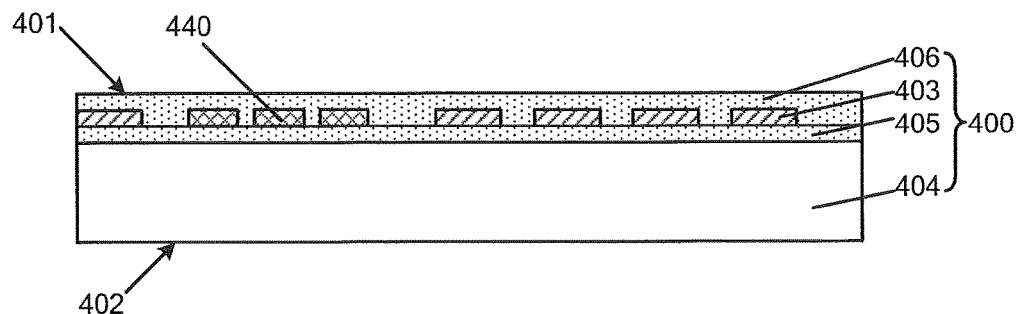
FIG. 15 to FIG. 16 are schematic sectional views of a structure of a MEMS microphone during a forming process according to an embodiment of the present disclosure.
Figure 16:
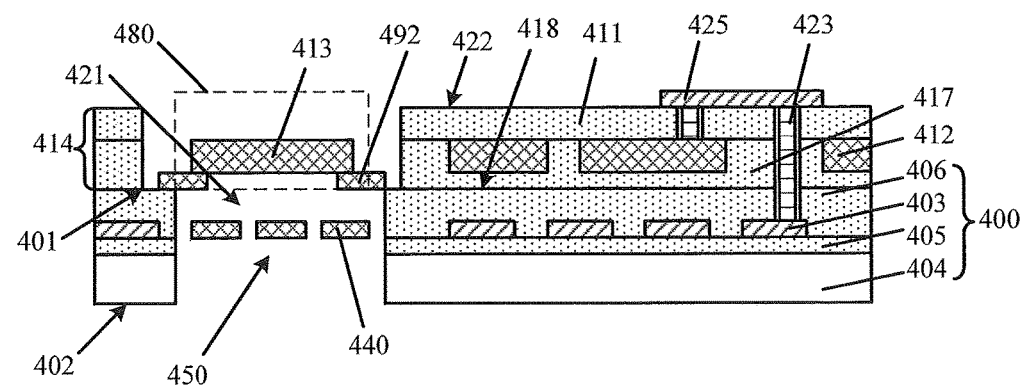

FIG. 15 to FIG. 16 are schematic sectional views of a structure of an MEMS microphone during a forming process according to an embodiment of the present disclosure.

Referring to FIG. 15, a first substrate 400 is provided. The first substrate 400 includes a first surface 401 and a second surface 402 opposite to the first surface 401. The first substrate 400 includes at least one conductive layer 403 located at the side of the first surface 401 of the first substrate 400. The first substrate 400 further includes a fixed electrode 440 located at the side of the first surface 401 of the first substrate 400.

In the embodiment, a first dielectric layer 405 is provided on a surface of a first base 404, and the fixed electrode 440 is formed on a surface of the first dielectric layer 405. Forming the fixed electrode 440 includes: depositing a second electrode layer on the surface of the first dielectric layer 405; forming a patterned layer on a surface of the second electrode layer, where a part of the surface of the second electrode layer is exposed through the patterned layer; and etching the second electrode layer by using the patterned layer as a mask until the surface of the first dielectric layer 405 is exposed. A process for forming the second electrode layer includes the chemical vapor deposition process, the physical vapor deposition process or the atomic layer deposition process. The patterned layer includes the patterned photoresist layer. A process for etching the conductive material layer includes a dry etching process.

In the embodiment, the fixed electrode 440 and the conductive layer 403 are located in the same layer, and the fixed electrode layer and the conductive layer 403 are formed simultaneously; and the fixed electrode 440 is comprised of metal, a metal compound or a semiconductor material doped with irons. In another embodiment, the fixed electrode may be formed before or after the conductive layer is formed; and the fixed electrode may be located in a different layer from the conductive layer.

In an embodiment, the first substrate 400 further includes a circuit including a semiconductor device structure and an electrical interconnection structure. The conductive layer 403 may be a conductive layer of the circuit, or may be a conductive layer added to the circuit. The conductive layer may be a conductor or a semiconductor.

In the embodiment, the conductive layer 403 is formed on or above the first base 404; and a first dielectric layer 405 is provided between the conductive layer 403 and the first base 404. The first substrate 400 may include a first coupling layer 406 located at the side of the first surface 401. The first base 404, the first dielectric layer 405, the conductive layer 403 and the first coupling layer 406 are respectively the same as those described in the preceding embodiments, which are not described here.

Referring to FIG. 16, a second substrate 414 is provided. The second substrate 414 includes a third surface 418 and a fourth surface opposite to the third surface 418. The second substrate 414 includes a second base and a sensitive electrode 413 located on or above the second base. The second substrate 414 includes a sensitive region 480 in which the sensitive electrode 413 is located. The sensitive electrode 413 is located at the side of the third surface 418 of the second substrate 414. The first surface 401 of the first substrate 400 and the third surface 418 of the second substrate 414 are bonded to each other. A cavity 421 is formed between the first substrate 400 and the sensitive region 480 of the second substrate 414. The second base is removed, to form a fifth surface 422 opposite to the third surface 418 of the second substrate 414. A first conductive plug 423 is formed from the side of the fifth surface 422 of the second substrate 414, with the first conductive plug 423 passing through to at least one of the conductive layers 403. The first conductive plug 423 is used to form an electrical connection between the conductive layer 403 and the sensitive electrode 413.

In the embodiment, no fixed electrode is formed in the second substrate 414, and the sensitive electrode 413 is formed on or above the second base. Forming the sensitive electrode 413 includes: forming a protective layer 411 on a surface of the second base; forming a first electrode layer 412 on a surface of the protective layer 411; and etching the first electrode layer 412, to form the sensitive electrode 413 in a sensitive region 480 of the second substrate 414. In the embodiment, after the second base is removed, an exposed surface of the protective layer 411 is the fifth surface 422.

In the embodiment, the method for forming the MEMS microphone further includes forming the cavity 421 between the sensitive electrode 413 and the fixed electrode 440. Forming the cavity 421 includes: forming a first opening before the first surface 401 of the first substrate 400 and the third surface 418 of the second substrate 414 are bonded to each other. The first opening is located at the side of the third surface 418 of the second substrate 414 or at the side of the first surface 401 of the first substrate 400. Alternatively, the first opening is located both at the side of the first surface 401 of the first substrate 400 and at the side of the third surface 418 of the second substrate 414. A position of the first opening corresponds to a position of the sensitive region 480. Forming the cavity 421 further includes: forming a cavity 421 between the first opening and the first surface 410 of the first substrate 400 after the first surface 401 of the first substrate 400 and the third surface 418 of the second substrate 414 are bonded to each other. In the embodiment, the first opening is formed at the side of the third surface 418 of the second substrate 414.

In the embodiment, the method for forming the MEMS microphone further includes: forming the first electrode layer 412, where the first electrode layer 412 includes the sensitive electrode 413; forming a second electrode layer, where the second electrode layer includes the fixed electrode 440; and forming a stopper 492, where the stopper 492 is located between the first electrode layer 412 and the second electrode layer, and a position of the stopper 492 corresponds to a position of the sensitive region 480. In the embodiment, the stopper 492 is formed in the second coupling layer 417.

In the embodiment, the method for forming the MEMS microphone further includes forming a second opening 450 in the first substrate 400. The second opening 450 is in communication with the cavity 421. The second opening 450 passes through the first substrate 400. Alternatively the second opening 450 is located at the side of the first surface 401 of the first substrate 400, and does not pass through the first substrate 400.

In the embodiment, the method for forming the MEMS microphone further includes: forming a third conductive plug in the protective layer 411; and forming a first conductive layer 425 on the fifth surface 422 of the second substrate 414. The first conductive layer 425 is electrically connected to the sensitive electrode 413 via the third conductive plug. The first conductive layer 425 is also located on a top surface of the first conductive plug 423, so that the first conductive plug 423 forms an electrical connection between the conductive layer 403 and the sensitive electrode 413.

In the embodiment, a second coupling layer 417 is provided at the side of the third surface 418 of the second substrate 414. A surface of the second coupling layer 417 is the third surface 418.

A step of providing the second substrate 414, a step of bonding the first substrate 400 and the second substrate 414 to each other, a step of removing the second base, a step of forming the first conductive plug 423, a step of forming the first conductive layer 425, a step of forming the cavity 421 and a step of forming the second opening 450 are respectively the same as those described in the preceding embodiments, which are not described here.

Accordingly, an MEMS microphone formed by using the above-described method is further provided according to the embodiment of the present disclosure. Referring still to FIG. 16, the MEMS microphone includes a first substrate 400. The first substrate 400 includes a first surface 401 and a second surface 402 opposite to the first surface 401. The first substrate 400 includes at least one conductive layer 403 located at the side of the first surface 401 of the first substrate 400. The first substrate 400 further includes the fixed electrode 440 located at the side of the first surface 401 of the first substrate 400. The MEMS microphone further includes a second substrate 414. The second substrate 414 includes a third surface 418 and a fifth surface 422 opposite to the third surface 418. The second substrate 414 includes a sensitive electrode 413. The second substrate 414 includes a sensitive region 480 in which the sensitive electrode 413 is located. The first surface 401 of the first substrate 400 and the third surface 422 of the second substrate 414 are bonded to each other. A cavity 421 is provided between the first substrate 400 and the sensitive region 480 of the second substrate 414. The MEMS microphone further includes a first conductive plug 423 formed from the side of the fifth surface 422 of the second substrate 414 and passing through to at least one of the conductive layers 403. The first conductive plug 423 is used to form an electrical connection between the conductive layer 403 and the sensitive electrode 413.

In the embodiment, the first dielectric layer 405 is provided on a surface of the first base 404, and the fixed electrode 440 is formed on the surface of the first dielectric layer 405. In the embodiment, the fixed electrode 440 and the conductive layer 403 are located in the same layer; and the fixed electrode 440 is comprised of metal, a metal compound or a semiconductor material doped with irons. In another embodiment, the fixed electrode may be located in a different layer form the conductive layer.

In an embodiment, the first substrate 400 further includes a circuit including a semiconductor device structure and an electrical interconnection structure. The conductive layer 403 may be a conductive layer of the circuit, or may be a conductive layer added to the circuit. The conductive layer may be a conductor or a semiconductor.

In the embodiment, the conductive layer 403 is formed on or above the first base 404; and a first dielectric layer 405 is provided between the conductive layer 403 and the first base 404. The first substrate 400 may include a first coupling layer 406 located at the side of the first surface 401. The first base 404, the first dielectric layer 405, the conductive layer 403 and the first coupling layer 406 are respectively the same as those described in the preceding embodiments, which are not described here.

In the embodiment, no fixed electrode is formed in the second substrate 414, and the sensitive electrode 413 is provided on or above the second base. A surface of the protective layer 411 is the fifth surface 422.

In the embodiment, the MEMS microphone further includes a second opening 450 located in the first substrate 400. The second opening 450 is in communication with the cavity 421. The second opening 450 passes through the first substrate 400. Alternatively, the second opening 450 is located at the side of the first surface 401 of the first substrate 400, and does not pass through the first substrate 400.

In the embodiment, the MEMS microphone further includes a first conductive layer 425 located on the fifth surface 422 of the second substrate 414. The first conductive layer 425 is electrically connected to the sensitive electrode 413 via a second electrode layer 490 and a first electrode layer 412. The first conductive layer 425 is also located on a top surface of the first conductive plug 423, so that the first conductive plug 423 forms an electrical connection between the conductive layer 404 and the sensitive electrode 413.

In the embodiment, a second coupling layer 417 is provided at the side of the third surface 418 of the second substrate 414. A surface of the second coupling layer 417 is the third surface 418.

The second substrate 414, the first conductive plug 423, the first conductive layer 425, the cavity 421 and the second opening 450 are respectively the same as those described in the preceding embodiments, which are not described here.

Fifth Embodiment

Figure 17:
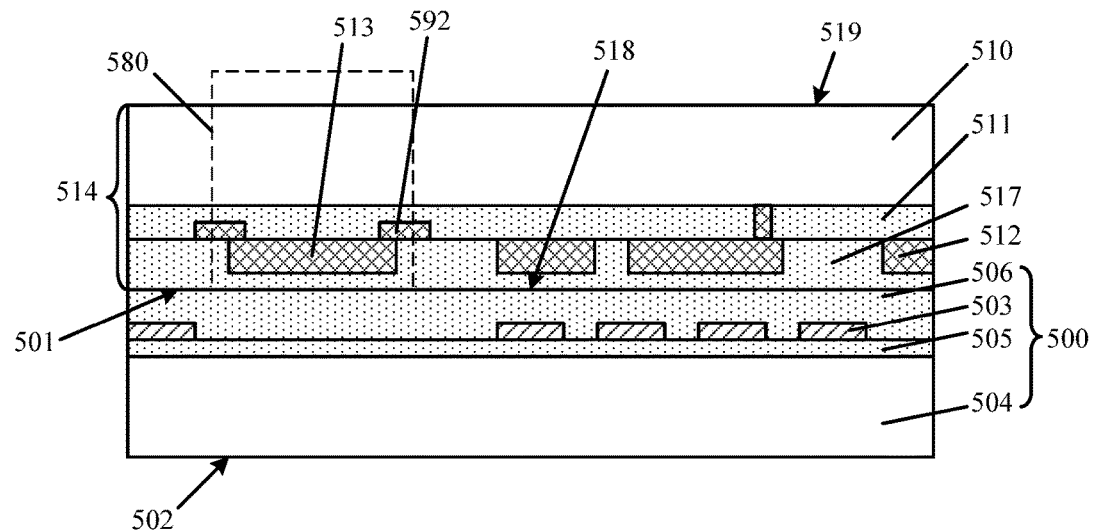
FIG. 17 to FIG. 19 are schematic sectional views of a structure of a MEMS microphone during a forming process according to an embodiment of the present disclosure.
Figure 18:
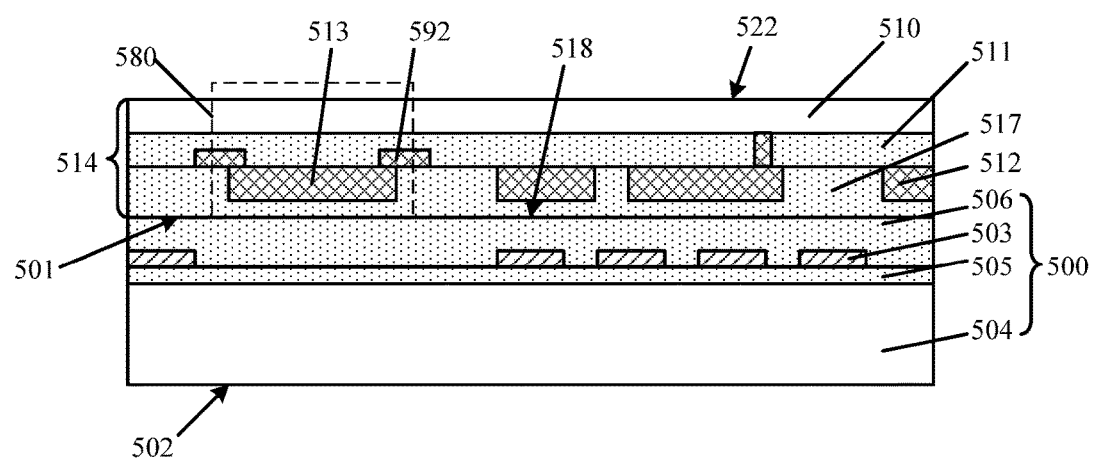
Figure 19:
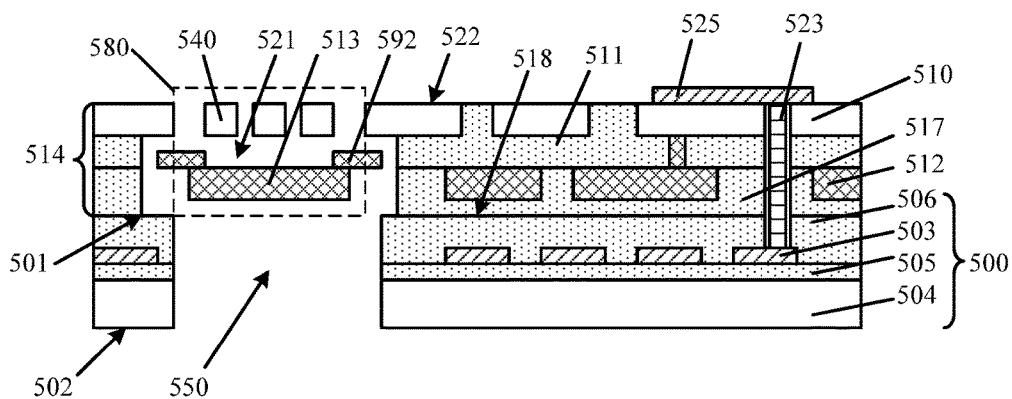

FIG. 17 to FIG. 19 are schematic sectional views of a structure of an MEMS microphone during a forming process according to an embodiment of the present disclosure.

Referring to FIG. 17, a first substrate 500 is provided. The first substrate 500 includes a first surface 501 and a second surface 502 opposite to the first surface 501. The first substrate 500 includes at least one conductive layer 503 located at the side of the first surface 501 of the first substrate 500. A second substrate 514 is provided. The second substrate 514 includes a third surface 518 and a fourth surface 519 opposite to the third surface 518. The second substrate 514 includes a second base 510 and a sensitive electrode 513 located on or above the second base 510. The second substrate 514 includes a sensitive region 580 in which the sensitive electrode 513 is located. The sensitive electrode 513 is located at the side of the third surface 518 of the second substrate 517. The first surface 501 of the first substrate 500 and the third surface 518 of the second substrate 514 are bonded to each other.

In the embodiment, the conductive layer 503 is formed on or above the first base 504; and a first dielectric layer 505 is provided between the conductive layer 503 and the first base 505. The first substrate 500 may include a first coupling layer 506 located at the side of the first surface 501. The first base 504, the first dielectric layer 505, the conductive layer 503 and the first coupling layer 506 are respectively the same as those described in the preceding embodiments, which are not described here.

In an embodiment, the first substrate 500 further includes a circuit including a semiconductor device structure and an electrical interconnection structure. The conductive layer 503 may be a conductive layer of the circuit, or may be a conductive layer added to the circuit. The conductive layer 503 may be a conductor or a semiconductor.

In the embodiment, a fixed electrode is formed in the second base 510, and the sensitive electrode 513 is formed on or above the second base 510. Forming the sensitive electrode 513 includes: forming a protective layer 511 on a surface of the second base; forming a first electrode layer 512 on a surface of the protective layer 511; and etching the first electrode layer 512, to form the sensitive electrode 513 in the sensitive region 580 of the second substrate 514. In the embodiment, a conductive plug is formed in the protective layer 511 for electrically connecting the first electrode layer 512 and the second base 510.

In the embodiment, the method for forming the MEMS microphone further includes: forming the first electrode layer 512 including the sensitive electrode 513; and forming a stopper 592 located between the second base 514 and the first electrode layer 512, where a position of the stopper 592 corresponds to a position of the sensitive region 580. In the embodiment, the stopper 592 is formed in the protective layer 511. In another embodiment, a second electrode layer is formed, and the second electrode layer includes the fixed electrode; the second base is used to form the sensitive electrode; and the stopper is located between the second base and the second electrode layer.

In the embodiment, a second coupling layer 517 is provided at the side of the third surface 518 of the second substrate 514. A surface of the second coupling layer 517 is the third surface 518.

A step of providing the second substrate 514, a step of bonding the first substrate 500 and the second substrate 514 to each other, a step of removing the second base, a step of forming the first conductive plug 523, a step of forming the first conductive layer 525, a step of forming a cavity 521 and a step of forming a second opening 550 are respectively the same as those described in the preceding embodiments, which are not described here.

Referring to FIG. 18, the second substrate 514 is thinned from a fourth surface 519 thereof (as shown in FIG. 17), and the second base 510 is removed partially, to form a fifth surface 522 opposite to the third surface 518 of the second substrate 514.

A process for thinning the fourth surface 519 includes a chemical mechanical polishing process. In the embodiment, the second surface 519 of the second substrate 514 is a surface of the second base 510. Thus, the second base 510 is thinned by the chemical mechanical polishing process. The thinned second base 510 located on a surface of the protective layer 511 is used to form the fixed electrode.

Referring to FIG. 19, a cavity 521 is formed between the first substrate 500 and the sensitive region 580 of the second substrate 514. A first conductive plug 523 is formed from the side of the fifth surface 522 of the second substrate 514, with the first conductive plug 523 passing through to at least one of the conductive layers 503. The first conductive plug 523 is used to form an electrical connection between the conductive layer 503 and the sensitive electrode 513.

In the embodiment, after the second base 510 is thinned, the second base 510 is etched, to form the fixed electrode 540 in the sensitive region 580. In addition, a second electrical interconnection layer may be formed by etching the second base 510. The second electrical interconnection layer is electrically connected to the fixed electrode 540.

In the embodiment, a second opening 550 is formed in the first substrate 500. The second opening 550 is in communication with the cavity 521. The second opening 550 passes through the first substrate 500. Alternatively, the second opening 550 is located at the side of the first surface 501 of the first substrate 500, and does not pass through the first substrate 500.

In the embodiment, a conductive plug forms an electrical connection between the first electrode layer 512 and the second base 510, the method for forming the MEMS microphone further includes forming a first conductive layer 525 on the fifth surface 522 of the second substrate 514. The first conductive layer 525 is electrically connected to the sensitive electrode 513 via the second base 510 and a first electrode layer 512. The first conductive layer 525 is also located on a top surface of the first conductive plug 523, so that the first conductive plug 523 forms an electrical connection between the conductive layer 503 and the sensitive electrode 513.

The first conductive plug 523, the first conductive layer 525, the cavity 521 and the second opening 550 are respectively the same as those described in the preceding embodiments, which are not described here.

Accordingly, an MEMS microphone formed by using the above-described method is further provided according to the embodiment of the present disclosure. Referring still to FIG. 19, the MEMS microphone includes a first substrate 500. The first substrate 500 includes a first surface 501 and a second surface 502 opposite to the first surface 501. The first substrate 500 includes at least one conductive layer 503 located at the side of the first surface 501 of the first substrate 500. The MEME microphone further includes a second substrate 514. The second substrate 514 includes a third surface 518 and a fifth surface 522 opposite to the third surface 518. The second substrate 514 includes a second base 510 and a sensitive electrode 513 located on or above the second base 510. The second substrate 514 includes a sensitive region 580 in which the sensitive electrode 513 is located. The sensitive electrode 513 is located at the side of the third surface 518 of the second substrate 514. The first surface 501 of the first substrate 500 and the third surface 518 of the second substrate 514 are bonded to each other. A cavity 521 is provided between the first substrate 500 and the sensitive region 580 of the second substrate 514. The MEMS microphone further includes a first conductive plug 523 formed from the side of the fifth surface 522 of the second substrate 514 and passing through to at least one of the conductive layers 503. The first conductive plug 523 is used to form an electrical connection between the conductive layer 503 and the sensitive electrode 513.

The above-described structure is explained in detail below.

In the embodiment, the conductive layer 503 is formed on or above the first base 504; and a first dielectric layer 505 is provided between the conductive layer 503 and the first base 504. The first substrate 500 may include a first coupling layer 506 located at the side of the first surface 501. The first base 504, the first dielectric layer 505, the conductive layer 503 and the first coupling layer 506 are respectively the same as those described in the preceding embodiments, which are not described here.

In an embodiment, the first substrate 500 further includes a circuit including a semiconductor device structure and an electrical interconnection structure. The conductive layer 503 may be a conductive layer of the circuit, or may be a conductive layer added to the circuit. The conductive layer 503 may be a conductor or a semiconductor.

In the embodiment, the second base 510 includes the fixed electrode, and the sensitive electrode 513 is formed on or above the second base 510. The fixed electrode is located in the sensitive region 580. The second base 510 further includes a second electrical interconnection layer electrically connected to the fixed electrode 540. In the embodiment, a conductive plug is provided in the protective layer 511 for forming an electrical connection between the first electrode layer 512 and the second base 510.

In the embodiment, the MEMS microphone further includes: the first electrode layer 512 including the sensitive electrode 513; and the stopper 592 located between the second base 514 and the first electrode layer 512. A position of the stopper 592 corresponds to a position of the sensitive region 580. In the embodiment, the stopper 592 is located in the protective layer 511. In another embodiment, the second substrate further includes the second electrode layer including the fixed electrode; the sensitive electrode is provided in the second base; and the stopper is located between the second base and the second electrode layer.

In the embodiment, a second coupling layer 517 is provided at the side of the third surface 518 of the second substrate 514. A surface of the second coupling layer 517 is the third surface 518.

In the embodiment, a second opening 550 is formed in the first substrate 500. The second opening 550 is in communication with the cavity 521. The second opening 550 passes through the first substrate 500. Alternatively, the second opening 550 is located at the side of the first surface 501 of the first substrate 500, and does not pass through the first substrate 500.

In the embodiment, a first conductive layer 525 is provided on the fifth surface 522 of the second substrate 514. The first conductive layer 525 is electrically connected to the sensitive electrode 513 via the second base 510 and a first electrode layer 512, since the conductive plug provides an electrical connection between the first electrode layer 512 and the second base 510. The first conductive layer 525 is also located on a top surface of the first conductive plug 523, so that the first conductive plug 523 forms an electrical connection between the conductive layer 505 and the sensitive electrode 513.

The second substrate 514, the first substrate 500, the first conductive plug 523, the first conductive layer 525, the cavity 521 and the second opening 550 are respectively the same as those described in the preceding embodiments, which are not described here.

Sixth Embodiment

Figure 20:
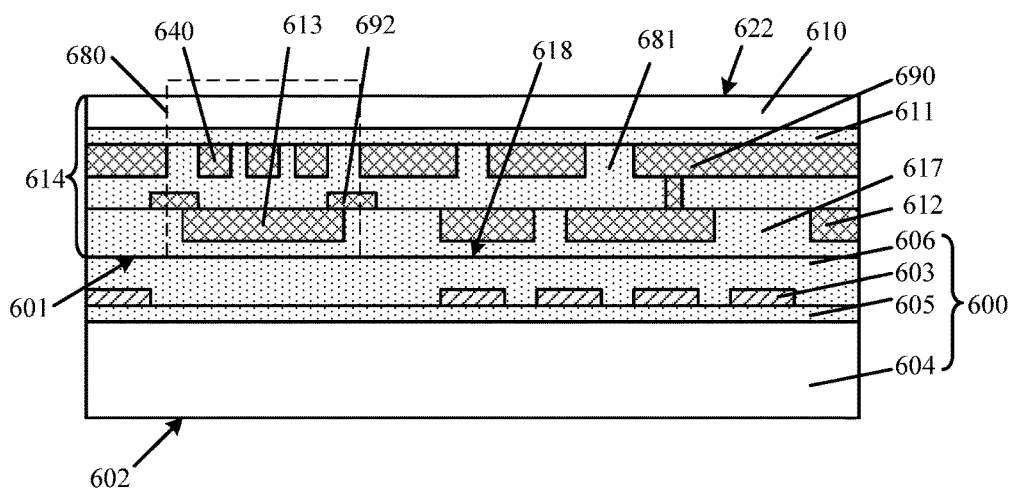
FIG. 20 to FIG. 22 are schematic sectional views of a structure of a MEMS microphone during a forming process according to an embodiment of the present disclosure.
Figure 21:
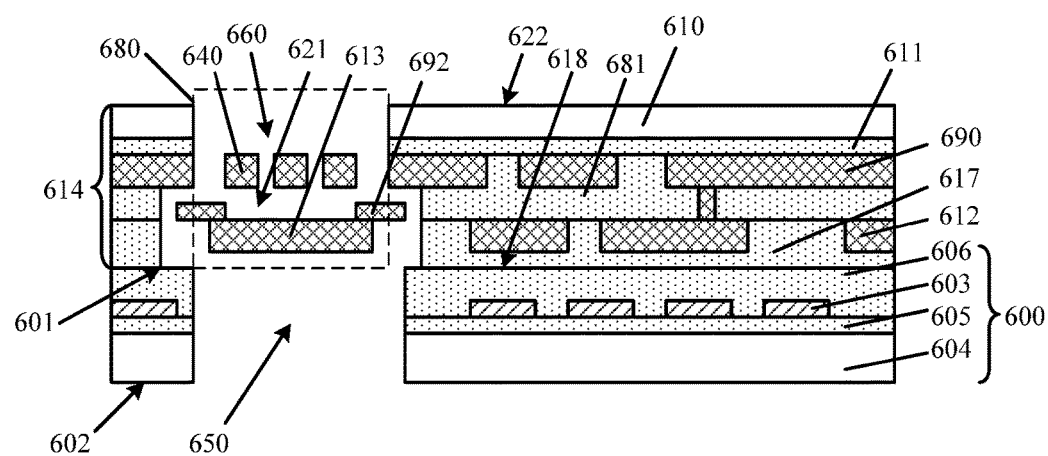
Figure 22:
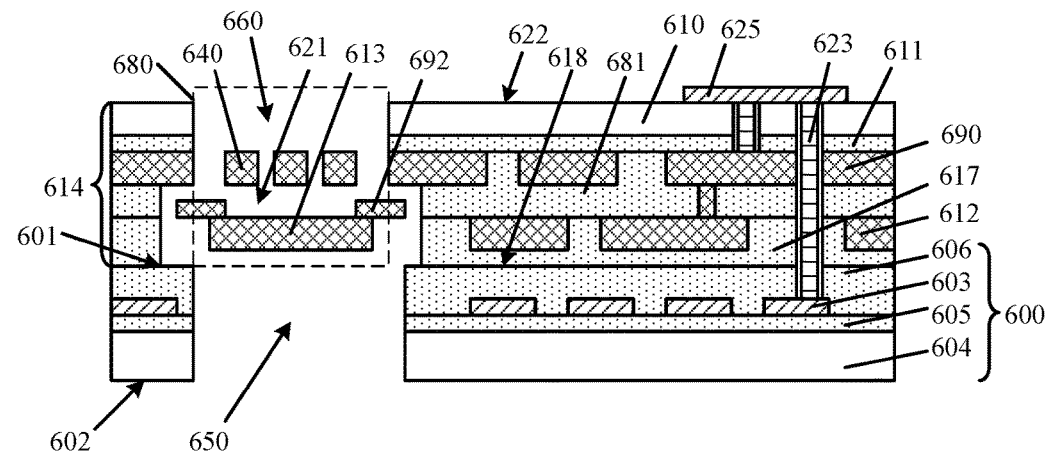

FIG. 20 to FIG. 22 are schematic sectional views of a structure of an MEMS microphone during a forming process according to an embodiment of the present disclosure.

Referring to FIG. 20, a first substrate 600 is provided. The first substrate 600 includes a first surface 601 and a second surface 602 opposite to the first surface 601. The first substrate 600 includes a first base 604 and at least one conductive layer 603 located at the side of the first surface 601 of the first substrate 600. A second substrate 614 is provided. The second substrate 614 includes a third surface 618 and a fourth surface opposite to the third surface 618. The second substrate 614 includes a second base 610 and a sensitive electrode 613 located on or above the second base 610. The second substrate 614 includes a sensitive region 680 in which the sensitive electrode 613 is located. The sensitive electrode 613 is located at the side of the third surface 618 of the second substrate 614. The first surface 601 of the first substrate 600 and the third surface 618 of the second substrate 614 are bonded to each other. A cavity 621 is formed between the first substrate 600 and the sensitive region 680 of the second substrate 614. The second substrate 614 is thinned from a fourth surface thereof, and the second base 610 is removed partially, to form a fifth surface 622 opposite to the third surface 618 of the second substrate 614.

In the embodiment, the second substrate 614 further includes a fixed electrode 640 located at the side of the third surface 618 of the second substrate 614. The fixed electrode 640 is formed between the second base 610 and the first electrode layer 612, and a position of the fixed electrode 640 corresponds to a position of the sensitive electrode 613.

In the embodiment, the sensitive electrode 613 is formed by etching the first electrode layer 612, and the fixed electrode 640 is formed by etching the second electrode layer 690. A second dielectric layer 681 is further provided between the first electrode layer 612 and the second electrode layer 690. The first electrode layer 612 is electrically connected to the sensitive electrode 613; and the second electrode layer 690 is electrically connected to the fixed electrode 640.

In the embodiment, a second coupling layer 617 is provided at the side of the third surface 618 of the second substrate 614. A surface of the second coupling layer 617 is the third surface 618.

A step of providing the second substrate 614, a step of bonding the first substrate 600 and the second substrate 614 to each other, and a step of thinning the fourth surface of the second substrate 614 are respectively the same as those described in the preceding embodiments, which are not described here.

Referring to FIG. 21, after the second substrate 614 is thinned from the fourth surface thereof, a third opening 660 is formed in the second substrate 614, and a position of the third opening 660 corresponds to a position of the sensitive region 680 of the second substrate 614.

The third opening 660 passes through the second base 610, and the fixed electrode 640 is exposed through the third opening 660. Alternatively, the third opening 660 does not pass through the second base 610, and a through hole in communication with the cavity 621 is formed in the second base 610 of the sensitive region 680, so that a sound wave is transferred to the sensitive electrode 613.

In an embodiment, at least one fifth through hole passing through the second base is formed at the side of the fifth surface of the second substrate, in a case that the third opening formed in the second base does not pass through the second base or no third opening is formed in the second base. A position of the fifth through hole corresponds to a position of the sensitive region. The fifth through hole may or may not be in communication with the cavity 621.

The second base including the fifth through hole may be used to filter out the dust in the air. The second base including the fifth through hole may also be used for electrical shielding. The second base located in the sensitive region may be used as a self-test electrode. When being supplied with a bias voltage, the second base may apply an electrostatic attraction to the sensitive electrode to detect whether the sensitive electrode operates normally.

In an embodiment, a distance from the sensitive electrode to the second base is less than a distance from the fixed electrode to the second base, and a protective layer or other insulating material located between the second base and the sensitive electrode may be removed, so that the sensitive electrode is not in contact with the second base.

Forming the third opening 660 includes: forming a patterned layer on the fifth surface 622 of the second substrate 614, where a position for forming the third opening 660 is exposed through the patterned layer; and etching the fifth surface 622 of the second substrate 614 by using the patterned layer as a mask, to form the third opening 660. The patterned layer is a patterned photoresist layer. The etching process includes a dry etching process which is anisotropic. In the embodiment, the fixed electrode 640 is exposed through the third opening 660.

A sensitive electrode film is formed in the sensitive region 680 of the second substrate 614. A part or all of a region except the sensitive region 680 is covered by the second base 610, thus a distance from the sensitive electrode 613 to an external environment is increased without affecting accurate acquisition of an external sound by the sensitive electrode 613, thereby protecting the sensitive electrode 613, and avoiding wear or other damage to the sensitive electrode or the protective layer 611 on a surface of the sensitive electrode. The second base 610 also has a function of electrical shielding.

In the embodiment, the method for forming the MEMS microphone further includes forming the second opening 650 in the first substrate 600. The second opening 650 is in communication with the cavity 621. The second opening 650 passes through the first substrate 600. Alternatively, the second opening 650 is located at the side of the first surface 601 of the first substrate 600, and does not pass through the first substrate 600.

Referring to FIG. 22, a first conductive plug 623 is formed from the side of the fifth surface 622 of the second substrate 614, with the first conductive plug 623 passing through to at least one of the conductive layers 603. The first conductive plug 623 is used to form an electrical connection between the conductive layer 603 and the sensitive electrode 613.

In the embodiment, the method for forming the MEMS microphone further includes: forming a third conductive plug from the side of the fifth surface 622 of the second substrate 614, with the third conductive plug passing through to the second electrode layer 690; and forming a first conductive layer 625 on the fifth surface 622 of the second substrate 614. The first conductive layer 625 is located on top surfaces of the first conductive plug 623 and the third conductive plug. The second electrode layer 690 is electrically connected to the first electrode layer 612 via a conductive plug in the second dielectric layer 681. Thus, the first conductive plug 623 may be electrically connected to the sensitive electrode 613 via the first conductive layer 625 and the third conductive plug.

A material, a structure and a forming step of the first conductive layer 625, the third conductive plug and the first conductive plug 623 are respectively the same as those described in the preceding embodiments, which are not described here.

Accordingly, an MEMS microphone formed by using the above-described method is further provided according to the embodiment of the present disclosure. Referring still to FIG. 22, the MEMS microphone includes a first substrate 600. The first substrate 600 includes a first surface 601 and a second surface 602 opposite to the first surface 601. The first substrate 600 includes at least one conductive layer 603 located closer to the first surface 601 of the first substrate 600. The MEMS microphone further includes a second substrate 614. The second substrate 614 includes a third surface 618 and a fifth surface 622 opposite to the third surface 618. The second substrate 614 includes a second base 610 and a sensitive electrode 613 located on or above the second base 610. The sensitive electrode 613 is located at the side of third surface 618 of the second substrate 614. A third opening 660 is formed in the second substrate 614. A position of the third opening 660 corresponds to a position of the sensitive electrode 613. The first surface 601 of the first substrate 600 and the third surface 618 of the second substrate 614 are bonded to each other. A cavity 621 is provided between the first substrate 600 and the second substrate 614. The MEMS microphone further includes: a first conductive plug 623 formed from the side of the fifth surface 622 of the second substrate 614 and passing through to the surface of the conductive layers 603; and a first conductive structure used to electrically connect the first conductive plug 623 to the sensitive electrode 613.

In the embodiment, the second substrate 614 further includes the fixed electrode 640 located at the side of the third surface 618 of the second substrate 614. The fixed electrode 640 is formed between the second base 610 and the first electrode layer 612, and a position of the fixed electrode 640 corresponds to a position of the sensitive electrode 613.

In the embodiment, the second substrate 614 further includes the first electrode layer 612 and the second electrode layer 690, and a second dielectric layer 681 is further provided between the first electrode layer 612 and the second electrode layer 690. The first electrode layer 612 is electrically connected to the sensitive electrode 613; and the second electrode layer 690 is electrically connected to the fixed electrode 640.

In the embodiment, a second coupling layer 617 is provided at the side of the third surface 618 of the second substrate 614. A surface of the second coupling layer 618 is the third surface 618.

The third opening 660 passes through the second base 610, and the fixed electrode 640 is exposed through the third opening 660. Alternatively, the third opening 660 does not pass through the second base 610, and a through hole in communication with the cavity 621 is formed in the second base 610 of the sensitive region 680, so that a sound wave is transferred to the sensitive electrode 613.

In an embodiment, at least one fifth through hole passing through the second base is formed at the side of the fifth surface of the second substrate, in a case that the third opening formed in the second base does not pass through the second base or no third opening is formed in the second base. A position of the fifth through hole corresponds to a position of the sensitive region. The fifth through hole may or may not be in communication with the cavity 621.

The second base including the fifth through hole may be used to filter out the dust in the air. The second base including the fifth through hole may also be used for electrical shielding. The second base located in the sensitive region may be used as a self-test electrode. When being supplied with a bias voltage, the second base may apply an electrostatic attraction to the sensitive electrode to detect whether the sensitive electrode operates normally.

In an embodiment, a distance from the sensitive electrode to the second base is less than a distance from the fixed electrode to the second base, and the sensitive electrode is not in direct contact with the second base.

In the embodiment, a third conductive plug is formed from the side of the fifth surface 622 of the second substrate 614, with the third conductive plug passing through to the second electrode layer 690. A first conductive layer 625 is formed on the fifth surface 622 of the second substrate 614. The first conductive layer 625 is located on top surfaces of the first conductive plug 623 and the third conductive plug. The second electrode layer 690 is electrically connected to the first electrode layer 612 via a conductive plug in the second dielectric layer 681. Thus, the first conductive plug 623 may be electrically connected to the sensitive electrode 613 via the first conductive layer 625 and the third conductive plug.

Seventh Embodiment

Figure 23:
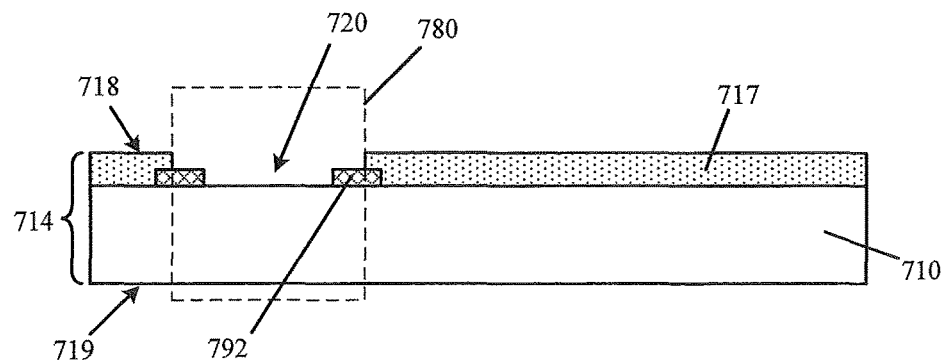
FIG. 23 to FIG. 25 are schematic sectional views of a structure of a MEMS microphone during a forming process according to an embodiment of the present disclosure.
Figure 24:
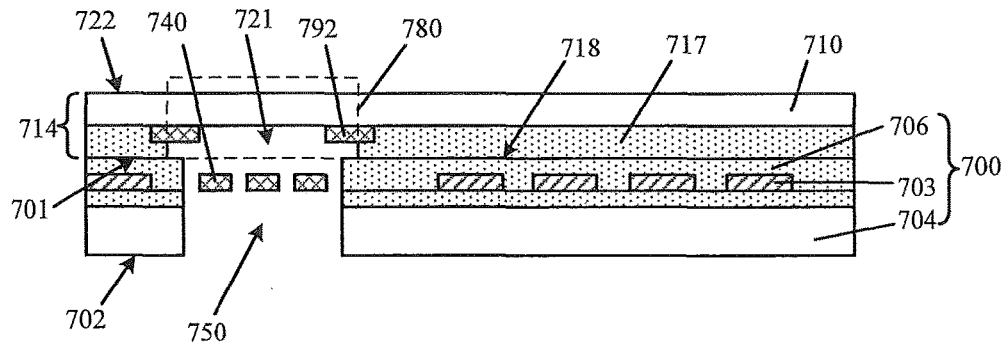
Figure 25:
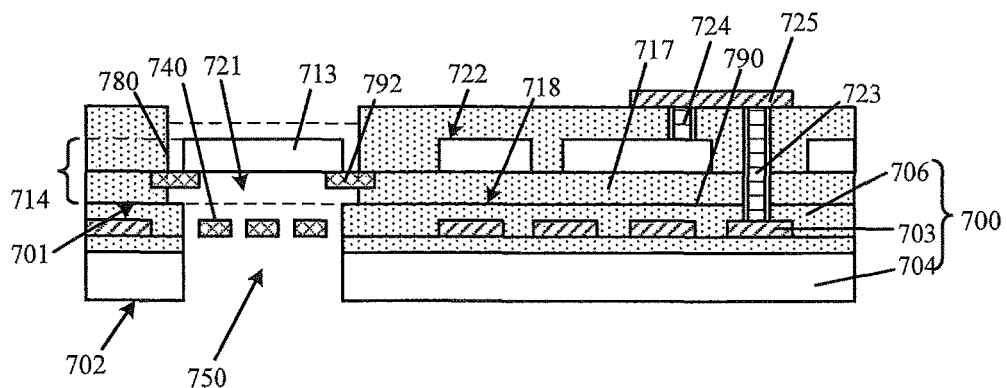

FIG. 23 to FIG. 25 are schematic sectional views of a structure of an MEMS microphone during a forming process according to an embodiment of the present disclosure.

Referring to FIG. 23, a second substrate 714 is provided. The second substrate 714 includes a third surface 718 and a fourth surface 719 opposite to the third surface 718. The second substrate 714 includes a second base 710 and a sensitive electrode located in the second base 710. The second substrate 714 includes a sensitive region 780 in which the sensitive electrode is located. The sensitive electrode is located at the side of the third surface 718 of the second substrate 714.

In the embodiment, the sensitive electrode is comprised of the second base 710 which is a body base. A second coupling layer 717 is further provided on a surface of the second base 710. The sensitive electrode is formed at the side of the second base 710 closer to the third surface 718 in the sensitive region 780. A material, a structure and a forming process of the second coupling layer 717 are respectively the same as those described in the preceding embodiments, which are not described here.

In another embodiment, the fixed electrode is formed on or above the second base 710. The fixed electrode is located at the side of the third surface 718 of the second substrate 714, and a position of the fixed electrode corresponds to a position of the sensitive region 780.

In the embodiment, a first opening 720 is provided at the side of the third surface 718 of the second substrate 714. A position of the first opening 720 corresponds to a position of the sensitive region 780. The first opening 720 is used to form a cavity with a first substrate provided subsequently. A forming process of the first opening 720 includes an etching process including a dry etching process which is anisotropic.

In the embodiment, a first electrode layer is formed subsequently, with the first electrode layer including the sensitive electrode. Alternatively, a second electrode layer is formed, with the second electrode layer including the fixed electrode; and a stopper 792 is formed, with the stopper 792 being located between the second base 710 and the first electrode layer or between the second base 710 and the second electrode layer, and a position of the stopper 792 corresponding to a position of the sensitive region 780.

Referring to FIG. 24, a first substrate 700 is provided. The first substrate 700 includes a first surface 701 and a second surface 702 opposite to the first surface 701. The first substrate 700 includes at least one conductive layer 703 located at the side of the first surface 701 of the first substrate 700. The first surface 701 of the first substrate 700 and the third surface 718 of the second substrate 714 are bonded to each other. A cavity 721 is formed between the first substrate 700 and the sensitive region 780 of the second substrate 714. Thinning is performed from the side of the fourth surface 719 of the second substrate 714, and the second base 710 is removed partially, to form the fifth surface 722 opposite to the third surface 718 of the second substrate 714.

In the embodiment, the first substrate 700 includes a first base 704, a first dielectric layer located on a surface of the first substrate 704, and a conductive layer 703 located on a surface of the first dielectric layer. The first substrate 700 may further include a circuit including a semiconductor device structure and an electrical interconnection structure. The conductive layer 703 may be a conductive layer of the circuit, or may be a conductive layer added to the circuit. The conductive layer 703 may be a conductor or a semiconductor.

In the embodiment, the first substrate 700 further includes a fixed electrode 740. The fixed electrode 740 is located at the side of the first surface 701 of the first substrate 700, and a position of the fixed electrode 740 corresponds to a position of the sensitive region 780 of the second substrate 714. In the embodiment, the fixed electrode 740 and the conductive layer 703 are located in the same layer.

In the embodiment, the first substrate 700 further includes a first coupling layer 706 located the side of the first surface 701. In an embodiment, at least one of the first coupling layer 706 and the second coupling layer 717 is comprised of an insulating material.

In an embodiment, a process for bonding the first surface 701 of the first substrate 700 and the third surface 718 of the second substrate 714 to each other includes a direct-bonding process. In another embodiment, a process for bonding the first surface 701 of the first substrate 700 and the third surface 718 of the second substrate 714 to each other is an adhesive bonding process; and the first coupling layer 706 or the second coupling layer 717 is an adhesive bonding layer, and is comprised of an insulating material, a semiconductor material, a metal material or an organic material.

In the embodiment, after the first substrate 700 and the second substrate 714 are bonded to each other, a cavity 721 may be formed between the first opening 720 located at the side of the third surface 718 of the second substrate 714 and the first substrate 700. A cavity 721 is formed between the sensitive electrode 713 and the fixed electrode 740.

In the embodiment, after the first substrate 700 and the second substrate 714 are bonded to each other, a second opening 750 is formed in the first substrate 700. The second opening 750 is in communication with the cavity 721; and the second opening 750 passes through the first substrate 700. In another embodiment, the second opening 750 is located at the side of the first surface 701 of the first substrate 700, and does not pass through the first substrate 700.

Referring to FIG. 25, after the second substrate 714 is thinned from the fourth surface 719 thereof (as shown in FIG. 23), the second base 710 (as shown in FIG. 24) is etched, to form the sensitive electrode 713. A first conductive plug 723 is formed from the side of the fifth surface 722 of the second substrate 714, with the first conductive plug 723 passing through to at least one of the conductive layers 703. The first conductive plug 723 is used to form an electrical connection between the conductive layer 703 and the sensitive electrode 713.

A position of the sensitive electrode 713 corresponds to a position of the sensitive region 780. In the embodiment, the second base 710 is etched to form a first electrode interconnection layer while the sensitive electrode 713 is formed. The first electrode interconnection layer is electrically interconnected to the sensitive electrode 713.

In the embodiment, after the sensitive electrode 713 is formed, a third dielectric layer is formed on surfaces of the second coupling layer 717 and the sensitive electrode 713. The first conductive plug 723 passes through the third dielectric layer, the second coupling layer 717 and the first coupling layer 706 until the first conductive plug 723 is connected to at least one conductive layer 703.

In the embodiment, the method for forming the MEMS microphone further includes: forming the third conductive plug electrically connected to the first electrode interconnection layer in the third dielectric layer; and forming a first conductive layer 725 on surfaces of the third dielectric layer, the third conductive plug and the first conductive plug 723. The first conductive plug 723 is electrically interconnected to the sensitive electrode 713 via the third conductive plug and the first conductive layer 725.

The first conductive plug 723, the third conductive plug and the first conductive layer 725 are respectively the same as those described in the preceding embodiments, which are not described here.

Eighth Embodiment

Figure 26:
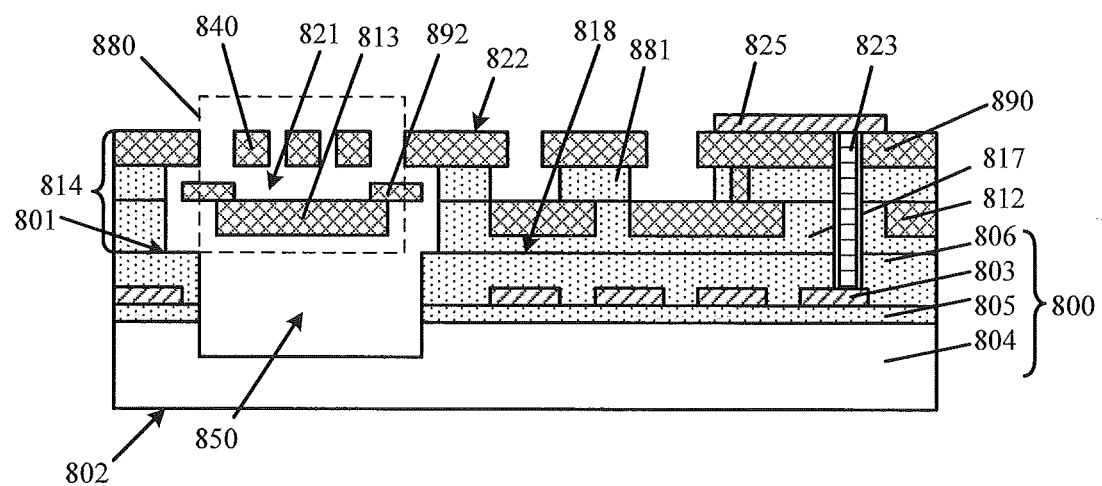
FIG. 26 to FIG. 27 are schematic sectional views of a structure of a MEMS microphone during a forming process according to an embodiment of the present disclosure.
Figure 27:
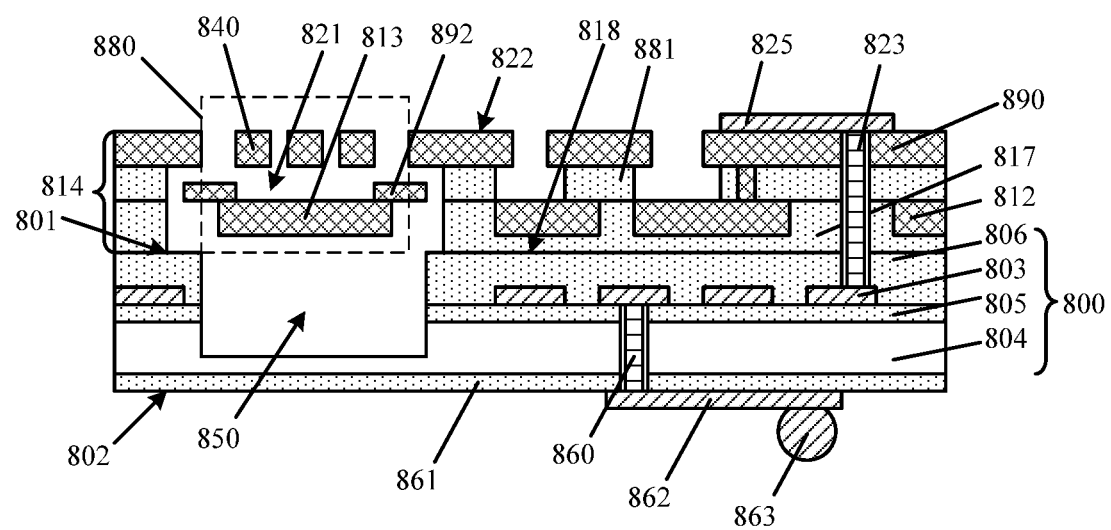

FIG. 26 to FIG. 27 are schematic sectional views of a structure of an MEMS microphone during a forming process according to an embodiment of the present disclosure.

Referring to FIG. 26, a first substrate 800 is provided. The first substrate 800 includes a first surface 801 and a second surface 802 opposite to the first surface 801. The first substrate 800 includes at least one conductive layer 803 located at the side of the first surface 801 of the first substrate 800. A second substrate 814 is provided. The second substrate 814 includes a third surface 818 and a fourth surface opposite to the third surface 818. The second substrate 814 includes a second base 810 and a sensitive electrode 813 located on or above the second base 810. The second substrate 814 includes a sensitive region 880 in which the sensitive electrode 813 is located. The sensitive electrode 813 is located at the side of the third surface 818 of the second substrate 814. The first surface 801 of the first substrate 800 and the third surface 818 of the second substrate 814 are bonded to each other. After the first surface 801 of the first substrate 800 and the third surface 818 of the second substrate 814 are bonded to each other, the second base is removed, to form a fifth surface 822 opposite to the third surface 818 of the second substrate 814. A cavity 821 is formed between the first substrate 800 and the sensitive region 880 of the second substrate 814. A first conductive plug 823 is formed from the side of the fifth surface 822 of the second substrate 814, with the first conductive plug 823 passing through to at least one of the conductive layers 803. The first conductive plug 823 is used to form an electrical connection between the conductive layer 803 and the sensitive electrode 813.

In the embodiment, a second opening 850 is formed in the first substrate 800. The second opening 850 is located at the side of the first surface 801 of the first substrate 800, and the second opening 850 does not pass through the first substrate 800. In another embodiment, the second opening may be formed at the side of the second surface of the first substrate after a fourth conductive plug is formed.

In the embodiment, the method further includes: forming a fixed electrode 840 at the side of the third surface 818 of the second substrate 814, where a position of the fixed electrode 840 corresponds to a position of the sensitive electrode 813; and forming the cavity 821 between the fixed electrode 840 and the sensitive electrode 813. In another embodiment, the fixed electrode may also be located in the first substrate, and the second substrate does not include the fixed electrode, and a position of the fixed electrode corresponds to a position of the sensitive region after the first surface of the first substrate and the third surface of the second substrate are bonded to each other.

The second substrate 814 further includes a second dielectric layer 881 located between a first electrical interconnection layer 812 and the second electrical interconnection layer 890. The second substrate 814 further includes a second coupling layer 817 located at the side of the third surface 818. The first substrate 800 includes a first coupling layer 806 located at the side of the first surface 801. A first conductive layer 825 is formed on the fifth surface 822 of the second substrate 814, and the first conductive layer 825 is also electrically connected to the first conductive plug 823 and the second electrical interconnection layer 890.

A step of providing the first substrate 800, a step of providing the second substrate 814, a step of bonding the first substrate 800 and the second substrate 814 to each other, a step of forming the cavity 821, a step of removing the second base and a step of forming the first conductive plug 823 are respectively the same as those described in the preceding embodiments, which are not described here.

Referring to FIG. 27, a fourth conductive plug 860 is formed from the side of the second surface 802 of the first substrate 800, with the fourth conductive plug 860 passing through to at least one of the conductive layers 803. The conductive layer 803 connected to the fourth conductive plug 860 and the conductive layer 803 connected to the first conductive plug 823 may be located in the same layer or in different layers.

In the embodiment, forming the fourth conductive plug 860 includes: forming a fourth dielectric layer 861 on the second surface of the first substrate 800, where the second surface 802 of a part of the first substrate 800 is exposed through the fourth dielectric layer 861; etching the first substrate 800 by using the fourth dielectric layer as a mask, until at least one conductive layer 803 is exposed, to form a fourth through hole in the first substrate 800; and forming the fourth conductive plug 860 in the fourth through hole.

In the embodiment, before the fourth dielectric layer 861 is formed, thinning may also be performed from the side of the second surface 802 of the first substrate 800, so that the difficulty of an etching process for forming the fourth through hole is lowered and an etching depth is decreased. In the embodiment, after the fourth conductive plug 860 is formed, the method further includes forming a fourth conductive layer 862 on a surface of the fourth dielectric layer. The fourth conductive layer 862 is also electrically connected to the fourth conductive plug 860. In addition, a solder ball 863 may be formed on a surface of a fourth conductive layer 862, and the solder ball 863 is used to electrically connect the formed MEMS microphone to a printed wiring board.

The fourth dielectric layer 861 is used to electrically isolate the fourth conductive layer 862 from the first base 804. The fourth dielectric layer 861 is comprised of silicon oxide, silicon nitride, silicon oxynitride, a low-k dielectric material or an ultra-low-k dielectric material. The fourth conductive layer 862 is comprised of a conductive material, including metal, a metal compound or a semiconductor material doped with irons. A process for etching to form the fourth through hole includes a dry etching process which is anisotropic. A process for thinning from the side of the second surface 802 of the first substrate 800 comprises a chemical mechanical polishing process.

Forming the fourth conductive plug 860 includes: forming a conductive film on the second surface 802 and in the fourth through hole for full-filling the fourth through hole; and removing undesired conductive film on the second surface 802, to form the fourth conductive plug 860. In an embodiment, the conductive film on the second surface 802 may be removed completely. In another embodiment, a part of the conductive film may be kept on the second surface 802.

An end of the fourth conductive plug 860 may be protruded, depressed or flush relative to the second surface 802.

In an embodiment, an insulating layer is formed on a surface of a side wall of the fourth through hole before the conductive film is formed, and a conductive film is formed after the insulating layer is formed for full-filling the fourth through hole. The insulating layer is used to electrically isolate the conductive film from the first base 804.

The fourth conductive plug 860 is comprised of copper, tungsten, aluminum, silver or gold. A process for forming the conductive film includes a physical vapor deposition process, a chemical vapor deposition process, an atomic layer deposition process, an electroplating process or a chemical plating process. A process for removing the conductive film on the second surface 802 includes a chemical mechanical polishing process. In addition, a first barrier layer may be formed on the surface of the side wall of the first through hole, and the conductive film is formed on a surface of the first barrier layer. The first barrier layer is comprised of one or more of titanium, tantalum, tantalum nitride or titanium nitride.

In another embodiment, before the first substrate and the second substrate are bonded to each other, the fourth conductive plug is formed at the side of the first surface 801 of the first substrate 800, and the fourth conductive plug may or may not pass through the first substrate 800. In a case that the fourth conductive plug does not pass through the first substrate 800, thinning is performed from the side of the second surface 802 of the first substrate 800 after the fourth conductive plug is formed, until the fourth conductive plug is exposed. In the embodiment, the formed fourth conductive plug is formed from the second surface 802 of the first substrate 800 and passes through to at least one of the conductive layers 803 at the side of the first surface 801 of the first substrate 800. Forming a fourth conductive plug includes: forming a fourth through hole at the side of the first surface 801 of the first substrate 800, where the fourth through hole passes through the first substrate 800 or not; forming the conductive film at the side of the first surface 801 and in the fourth through hole for full-filling the fourth through hole; and removing undesired conductive film at the side of the first surface 801, to form the fourth conductive plug. In an embodiment, the insulating film is formed at a surface of a side wall of the fourth through hole before the conductive film is formed, and the conductive film is formed after the insulating layer is formed for full-filling the fourth through hole. The insulating layer is used to electrically isolate the conductive film from the first base 804.

Although the present disclosure is disclosed above, the present disclosure is not limited thereto. Various changes and modifications can be made by those skilled in the art without departing from the spirit and scope of the present disclosure. Therefore, the scope of protection of the present disclosure should be defined by the claims.

The invention claimed is:

1. A method for forming a Micro-Electro-Mechanical System (MEMS) microphone, comprising:
    providing a first substrate, wherein the first substrate comprises a first surface and a second surface opposite to the first surface, the first substrate comprises at least one conductive layer located at the side of the first surface of the first substrate;
    providing a second substrate, wherein the second substrate comprises a third surface and a fourth surface opposite to the third surface, the second substrate comprises a second base and a sensitive electrode located on or above the second base, the second substrate comprises a sensitive region in which the sensitive electrode is located, the sensitive electrode is located at the side of the third surface of the second substrate;
    bonding the first surface of the first substrate and the third surface of the second substrate to each other;
    removing the second base to form a fifth surface opposite to the third surface of the second substrate, after the first surface of the first substrate and the third surface of the second substrate are bonded to each other;
    forming a cavity between the first substrate and the sensitive region of the second substrate; and
    forming a first conductive plug from the side of the fifth surface of the second substrate, with the first conductive plug passing through to at least one of the conductive layers, wherein the first conductive plug is used to form an electrical connection between the conductive layer and the sensitive electrode.

2. The method for forming the MEMS microphone according to claim 1, further comprising:
    forming a fixed electrode, wherein the fixed electrode is located at the side of the first surface of the first substrate or at the side of the third surface of the second substrate;
    a position of the fixed electrode corresponding to a position of the sensitive electrode after the first surface of the first substrate and the third surface of the second substrate are bonded to each other; and
    forming a cavity between the fixed electrode and the sensitive electrode.

3. The method for forming the MEMS microphone according to claim 2, further comprising:
    forming a first electrode layer, wherein the first electrode layer comprises the sensitive electrode;
    forming a second electrode layer, wherein the second electrode layer comprises the fixed electrode; and
    forming a stopper, wherein the stopper is located between the first electrode layer and the second electrode layer, with a position of the stopper corresponding to a position of the sensitive region.

4. The method for forming the MEMS microphone according to claim 2, wherein in a case that the fixed electrode is located at the side of the first surface of the first substrate, the forming the cavity comprises:
    forming a first opening before the first surface of the first substrate and the third surface of the second substrate are bonded to each other, wherein the first opening is located at the side of the third surface of the second substrate or at the side of the first surface of the first substrate, or the first opening is located both at the side of the first surface of the first substrate and at the side of the third surface of the second substrate, with a position of the first opening corresponding to a position of the sensitive region; and forming a cavity between the first opening and the first surface of the first substrate when the first surface of the first substrate and the third surface of the second substrate are bonded to each other.

5. The method for forming the MEMS microphone according to claim 2, wherein the forming the second substrate comprises:

providing a semiconductor on insulator substrate, wherein the semiconductor on insulator substrate comprises a base, an insulating layer on a surface of the base, and a semiconductor layer on a surface of the insulating layer;

etching the semiconductor layer to form the fixed electrode or the sensitive electrode; and providing the second base as the base.

6. The method for forming the MEMS microphone according to claim 1, further comprising:

forming a second opening in the first substrate; and a position of the second opening corresponding to a position of the sensitive region of the second substrate after the first surface of the first substrate and the third surface of the second substrate are bonded to each other.

7. The method for forming the MEMS microphone according to claim 6, wherein the second opening is located at the side of the first surface of the first substrate; or the second opening passes through the first substrate.

8. The method for forming the MEMS microphone according to claim 1, further comprising forming a material layer at the side of the third surface of the second substrate, wherein the second substrate further comprises a first electrode layer located on or above the second base, the first electrode layer comprises the sensitive electrode, and the material layer is located between the first electrode layer and the first substrate after the first surface of the first substrate and the third surface of the second substrate are bonded to each other.

9. The method for forming the MEMS microphone according to claim 1, wherein the first substrate further comprises a circuit.

10. The method for forming the MEMS microphone according to claim 1, wherein the second substrate further comprises a second coupling layer located at the side of the third surface, or the first substrate comprises a first coupling layer located at the side of the first surface; or the second substrate further comprises a second coupling layer located at the side of the third surface, and the first substrate comprises a first coupling layer located at the side of the first surface.

11. The method for forming the MEMS microphone according to claim 10, wherein at least one of the first coupling layer and the second coupling layer is comprised of an insulating material.

12. The method for forming the MEMS microphone according to claim 10, wherein the first surface of the first substrate and the third surface of the second substrate are bonded to each other by an adhesive bonding process; and the first coupling layer or the coupling layer is an adhesive bonding layer comprised of an insulating material, a semiconductor material, a metal material or an organic material.

13. The method for forming the MEMS microphone according to claim 1, wherein the first surface of the first substrate and the third surface of the second substrate are bonded to each other by a direct-bonding process.

14. The method for forming the MEMS microphone according to claim 1, wherein the first substrate further comprises a self-test electrode, with a position of the self-test electrode corresponding to a position of the sensitive region after the first surface of the first substrate and the third surface of the second substrate are bonded to each other.

15. The method for forming the MEMS microphone according to claim 1, further comprising forming a fourth conductive plug from the side of the second surface of the first substrate, with the fourth conductive plug passing through to at least one of the conductive layers.

16. A method for forming a Micro-Electro-Mechanical System (MEMS) microphone, comprising:

providing a first substrate, wherein the first substrate comprises a first surface and a second surface opposite to the first surface, the first substrate comprises at least one conductive layer located at the side of the first surface of the first substrate;

providing a second substrate, wherein the second substrate comprises a third surface and a fourth surface opposite to the third surface, the second substrate comprises a second base and a sensitive electrode located on or above or in the second base, the second substrate comprises a sensitive region in which the sensitive electrode is located, the sensitive electrode is located at the side of the third surface of the second substrate;

bonding the first surface of the first substrate and the third surface of the second substrate to each other;

thinning the second substrate from the fourth surface of the second substrate and removing the second base partially to form a fifth surface opposite to the third surface of the second substrate, after the first surface of the first substrate and the third surface of the second substrate are bonded to each other;

forming a cavity between the first substrate and the sensitive region of the second substrate; and forming a first conductive plug from the side of the fifth surface of the second substrate, with the first conductive plug passing through to at least one of the conductive layers, wherein the first conductive plug is used to form an electrical connection between the conductive layer and the sensitive electrode.

17. The method for forming the MEMS microphone according to claim 16, further comprising:

forming a fixed electrode, wherein the fixed electrode is located at the side of the third surface of the second substrate;

a position of the fixed electrode corresponding to a position of the sensitive electrode after the first surface of the first substrate and the third surface of the second substrate are bonded to each other; and forming a cavity between the fixed electrode and the sensitive electrode.

18. The method for forming the MEMS microphone according to claim 16, wherein in a case that the sensitive electrode is located on or above the second base, the method further comprises etching the second base to form a fixed electrode after second substrate is thinned from the fourth surface of the second substrate.

19. The method for forming the MEMS microphone according to claim 17, further comprising:
   forming a first electrode layer, wherein the first electrode layer comprises the sensitive electrode; or
   forming a second electrode layer, wherein the second electrode layer comprises the fixed electrode; and
   forming a stopper, wherein the stopper is located between the second base and the first electrode layer or between the second base and the second electrode layer, with a position of the stopper corresponding to a position of the sensitive region.

20. The method for forming the MEMS microphone according to claim 17, wherein the forming the second substrate comprises:
   providing a semiconductor on insulator substrate, wherein the semiconductor on insulator substrate comprises a base, an insulating layer on a surface of the base, and a semiconductor layer on a surface of the insulating layer;
   etching the semiconductor layer to form the fixed electrode or the sensitive electrode; and
   providing the second base as the base.

21. The method for forming the MEMS microphone according to claim 16, wherein in a case that the sensitive electrode is located on or above the second base, the method further comprises forming a third opening at the side of the fifth surface of the second substrate, with a position of the third opening corresponding to a position of the sensitive region.

22. The method for forming the MEMS microphone according to claim 16, further comprising forming at least one fifth through hole passing through the second base at the side of the fifth surface of the second substrate, with a position of the fifth through hole corresponding to a position of the sensitive region.

23. The method for forming the MEMS microphone according to claim 16, wherein in a case that the sensitive electrode is located in the second base, the method further comprises etching the second base to form the sensitive electrode after the second substrate is thinned from the fourth surface of the second substrate.

24. The method for forming the MEMS microphone according to claim 16, further comprising:
   forming a second opening in the first substrate; and
   a position of the second opening corresponding to a position of the sensitive region of the second substrate after the first surface of the first substrate and the third surface of the second substrate are bonded to each other.

25. The method for forming the MEMS microphone according to claim 24, wherein
   the second opening is located at the side of the first surface of the first substrate; or
   the second opening passes through the first substrate.

26. The method for forming the MEMS microphone according to claim 16, further comprising forming a material layer at the side of the third surface of the second substrate, wherein the second substrate further comprises a first electrode layer located on or above the second base, the first electrode layer comprises the sensitive electrode, and the material layer is located between the first electrode layer and the first substrate after the first surface of the first substrate and the third surface of the second substrate are bonded to each other.

27. The method for forming the MEMS microphone according to claim 16, wherein the first substrate further comprises a circuit.

28. The method for forming the MEMS microphone according to claim 16, wherein
   the second substrate further comprises a second coupling layer located at the side of the third surface, or the first substrate comprises a first coupling layer located at the side of the first surface; or
   the second substrate further comprises a second coupling layer located at the side of the third surface, and the first substrate comprises a first coupling layer located at the side of the first surface.

29. The method for forming the MEMS microphone according to claim 28, wherein at least one of the first coupling layer and the second coupling layer is comprised of an insulating material.

30. The method for forming the MEMS microphone according to claim 28, wherein
   the first surface of the first substrate and the third surface of the second substrate are bonded to each other by an adhesive bonding process; and
   the first coupling layer or the second coupling layer is an adhesive bonding layer comprised of an insulating material, a semiconductor material, a metal material or an organic material.

31. The method for forming the MEMS microphone according to claim 16, wherein the first surface of the first substrate and the third surface of the second substrate are bonded to each other by a direct-bonding process.

32. The method for forming the MEMS microphone according to claim 16, wherein the first substrate further comprises a self-test electrode, with a position of the self-test electrode corresponding to a position of the sensitive region after the first surface of the first substrate and the third surface of the second substrate are bonded to each other.

33. The method for forming the MEMS microphone according to claim 16, further comprising forming a fourth conductive plug from the side of the second surface of the first substrate, with the fourth conductive plug passing through to at least one of the conductive layers.

34. A Micro-Electro-Mechanical System (MEMS) microphone, comprising:
   a first substrate, wherein the first substrate comprises a first surface and a second surface opposite to the first surface, the first substrate comprises at least one conductive layer located at the side of the first surface of the first substrate;
   a second substrate, wherein the second substrate comprises a third surface and a fifth surface opposite to the third surface, the second substrate comprises a sensitive electrode, the second substrate comprises a sensitive region in which the sensitive electrode is located, the first surface of the first substrate and the third surface of the second substrate are bonded to each other;
   a cavity located between the first substrate and the sensitive region of the second substrate; and
   a first conductive plug formed from the side of the fifth surface of the second substrate and passing through to at least one of the conductive layers, wherein the first conductive plug is used to form an electrical connection between the conductive layer and the sensitive electrode.

35. The MEMS microphone according to claim 34, further comprising:
   a fixed electrode, wherein the fixed electrode is located at the side of the first surface of the first substrate or at the side of the third surface of the second substrate, with a position of the fixed electrode corresponding to a position of the sensitive electrode after the first surface of the first substrate and the third surface of the second substrate are bonded to each other; and a cavity located between the fixed electrode and the sensitive electrode.

36. The MEMS microphone according to claim 35, wherein the second substrate further comprises a first electrode layer comprising the sensitive electrode;

the first substrate or the second substrate further comprises a second electrode layer comprising the fixed electrode; and the MEMS microphone further comprises a stopper located between the first electrode layer and the second electrode layer, with a position of the stopper corresponding to a position of the sensitive region.

37. The MEMS microphone according to claim 34, further comprising a second opening in the first substrate, with a position of the second opening corresponding to a position of the sensitive region of the second substrate.

38. The MEMS microphone according to claim 37, wherein the second opening is located at the side of the first surface of the first substrate; or the second opening passes through the first substrate.

39. The MEMS microphone according to claim 34, further comprising a material layer located at the side of the third surface of the second substrate, wherein the second substrate further comprises a first electrode layer located on or above the second base, the first electrode layer comprises the sensitive electrode, and the material layer is located between the first electrode layer and the first substrate.

40. The MEMS microphone according to claim 34, wherein the first substrate further comprises a circuit.

41. The MEMS microphone according to claim 34, wherein the second substrate further comprises a second coupling layer located at the side of the third surface, or the first substrate comprises a first coupling layer located at the side of the first surface; or the second substrate further comprises a second coupling layer located at the side of the third surface, and the first substrate comprises a first coupling layer located at the side of the first surface.

42. The MEMS microphone according to claim 41, wherein at least one of the first coupling layer and the second coupling layer is comprised of an insulating material.

43. The MEMS microphone according to claim 41, wherein the first coupling layer or the second coupling layer is an adhesive bonding layer comprised of an insulating material, a semiconductor material, a metal material or an organic material.

44. The MEMS microphone according to claim 41, wherein the first coupling layer or the second coupling layer is a bonding layer; or the first coupling layer and the second coupling layer each are bonding layers.

45. The MEMS microphone according to claim 34, wherein the first substrate further comprises a self-test electrode, with a position of the self-test electrode corresponding to a position of the sensitive region.

46. The MEMS microphone according to claim 34, further comprising a fourth conductive plug formed from the side of the second surface of the first substrate and passing through to at least one of the conductive layers.

47. A Micro-Electro-Mechanical System (MEMS) microphone, comprising:

a first substrate, wherein the first substrate comprises a first surface and a second surface opposite to the first surface, the first substrate comprises at least one conductive layer located at the side of the first surface of the first substrate;

a second substrate, wherein the second substrate comprises a third surface and a fifth surface opposite to the third surface, the second substrate comprises a second base and a sensitive electrode located on or above or in the second base, the second substrate comprises a sensitive region in which the sensitive electrode is located, the first surface of the first substrate and the third surface of the second substrate are bonded to each other;

a cavity located between the first substrate and the sensitive region of the second substrate; and a first conductive plug formed from the side of the fifth surface of the second substrate and passing through to at least one of the conductive layers, wherein the first conductive plug is used to form an electrical connection between the conductive layer and the sensitive electrode.

48. The MEMS microphone according to claim 47, further comprising:

a fixed electrode, wherein the fixed electrode is located at the side of the third surface of the second substrate, with a position of the fixed electrode corresponding to a position of the sensitive electrode; and a cavity located between the fixed electrode and the sensitive electrode.

49. The MEMS microphone according to claim 48, wherein the fixed electrode is located in the second base in a case that the sensitive electrode is located on or above the second base.

50. The MEMS microphone according to claim 48, wherein the second substrate further comprises a first electrode layer located on or above the second base, with the first electrode layer comprising the sensitive electrode;

the first substrate or the second substrate further comprises a second electrode layer comprising the fixed electrode; and the MEMS microphone further comprises a stopper located between the first electrode layer and the second electrode layer, with a position of the stopper corresponding to a position of the sensitive region.

51. The MEMS microphone according to claim 47, wherein in a case that the sensitive electrode is located on or above the second base, the MEMS microphone further comprises a third opening located at the side of the fifth surface of the second substrate, with a position of the third opening corresponding to a position of the sensitive region.

52. The MEMS microphone according to claim 47, further comprising at least one fifth through hole located at the side of the fifth surface of the second substrate and passing through the second base, with a position of the fifth through hole corresponding to a position of the sensitive region.

53. The MEMS microphone according to claim 47, further comprising a second opening in the first substrate, with a position of the second opening corresponding to a position of the sensitive region of the second substrate.

54. The MEMS microphone according to claim 53, wherein the second opening is located at the side of the first surface of the first substrate; or the second opening passes through the first substrate.

55. The MEMS microphone according to claim 47, further comprising a material layer located at the side of the third surface of the second substrate, wherein the second substrate further comprises a first electrode layer located on or above the second base, the first electrode layer comprises the sensitive electrode, and the material layer is located between the first electrode layer and the first substrate.

56. The MEMS microphone according to claim 47, wherein the first substrate further comprises a circuit.

57. The MEMS microphone according to claim 47, wherein the second substrate further comprises a second coupling layer located at the side of the third surface, or the first substrate comprises a first coupling layer located at the side of the first surface; or the second substrate further comprises a second coupling layer located at the side of the third surface, and the first substrate comprises a first coupling layer located at the side of the first surface.

58. The MEMS microphone according to claim 57, wherein at least one of the first coupling layer and the second coupling layer is comprised of an insulating material.

59. The MEMS microphone according to claim 57, wherein the first coupling layer or the second coupling layer is an adhesive bonding layer comprised of an insulating material, a semiconductor material, a metal material or an organic material.

60. The MEMS microphone according to claim 57, wherein the first coupling layer or the second coupling layer is a bonding layer; or the first coupling layer and the second coupling layer each are bonding layers.

61. The MEMS microphone according to claim 47, wherein the first substrate further comprises a self-test electrode, with a position of the self-test electrode corresponding to a position of the sensitive region.

62. The MEMS microphone according to claim 47, further comprising a fourth conductive plug formed from the side of the second surface of the first substrate and passing through to at least one of the conductive layers.

* * * * *